US011854959B2

(12) United States Patent
Kao et al.

(10) Patent No.: US 11,854,959 B2
(45) Date of Patent: Dec. 26, 2023

(54) METAL-INSULATOR-METAL DEVICE WITH IMPROVED PERFORMANCE

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsin-Chu (TW); Hsing-Chih Lin, Tainan (TW); Kuan-Hua Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/352,969

(22) Filed: Jun. 21, 2021

(65) Prior Publication Data
US 2022/0310507 A1    Sep. 29, 2022

Related U.S. Application Data

(60) Provisional application No. 63/166,355, filed on Mar. 26, 2021.

(51) Int. Cl.
*H01L 23/522* (2006.01)
*H01L 23/528* (2006.01)
*H01L 27/04* (2006.01)
*H01L 49/02* (2006.01)

(52) U.S. Cl.
CPC .......... *H01L 23/5223* (2013.01); *H01L 28/87* (2013.01); *H01L 28/91* (2013.01)

(58) Field of Classification Search
CPC ..... H01L 23/5223; H01L 28/40; H01L 28/87; H01L 28/91; H01L 27/04
See application file for complete search history.

(56) References Cited

U.S. PATENT DOCUMENTS

| 2009/0141426 | A1* | 6/2009 | Hwang | H01L 28/91 361/321.2 |
| 2015/0145103 | A1* | 5/2015 | Chou | H01L 28/91 438/387 |
| 2016/0268144 | A1 | 9/2016 | Voiron et al. | |
| 2019/0035674 | A1* | 1/2019 | Chiu | H01L 23/5223 |
| 2019/0229053 | A1* | 7/2019 | Hung | H01L 23/5223 |
| 2021/0005707 | A1* | 1/2021 | Lu | H01L 28/90 |
| 2021/0091169 | A1 | 3/2021 | Lin et al. | |

FOREIGN PATENT DOCUMENTS

| CN | 112542544 A | 3/2021 |
| TW | 201530727 A | 8/2015 |

* cited by examiner

*Primary Examiner* — Omar F Mojaddedi
(74) *Attorney, Agent, or Firm* — Eschweiler & Potashnik, LLC

(57) ABSTRACT

Various embodiments of the present disclosure are directed towards an integrated chip (IC). The IC comprises a first inter-metal dielectric (IMD) structure disposed over a semiconductor substrate. A metal-insulator-metal (MIM) device is disposed over the first IMD structure. The MIM device comprises at least three metal plates that are spaced from one another. The MIM device further comprises a plurality of capacitor insulator structures, where each of the plurality of capacitor insulator structures are disposed between and electrically isolate neighboring metal plates of the at least three metal plates.

20 Claims, 10 Drawing Sheets

METAL-INSULATOR-METAL DEVICE WITH IMPROVED PERFORMANCE

REFERENCE TO RELATED APPLICATION

This application claims the benefit of U.S. Provisional Application No. 63/166,355, filed on Mar. 26, 2021, the contents of which are hereby incorporated by reference in their entirety.

BACKGROUND

Integrated circuits (ICs) are formed on semiconductor dies comprising millions or billions of transistor devices. The transistor devices are configured to act as switches and/or to produce power gains so as to enable logical functionality. ICs also comprise passive devices used to control gains, time constants, and other IC characteristics. One type of passive device is a metal-insulator-metal (MIM) capacitor. MIM capacitors find application as, among other things, decoupling capacitors for high performance computing (HPC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
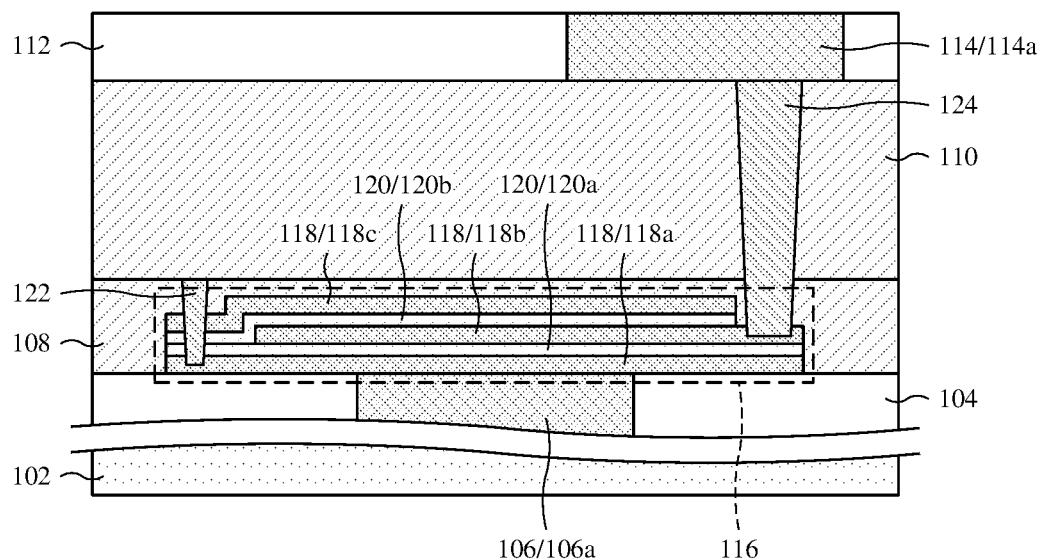
FIGS. 1A-1B illustrates various views of some embodiments of an integrated chip (IC) having a metal-insulator-metal (MIM) device with improved performance.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a metal-insulator-metal (MIM) device (e.g., a MIM capacitor) comprises a bottom metal plate, a top metal plate over the bottom metal plate, and a capacitor insulator structure between the bottom and top metal plates. However, as integrated chips (ICs) are continually scaled down (e.g., pixel sizes are reduced), the typical MIM devices are failing to providing the performance (e.g., capacitance per unit area) required for specific applications. As such, a MIM device having improved performance (e.g., increased capacitance for a given layout area) is desirable to increase the applications in which MIM devices are utilized.

Various embodiments of the present disclosure are directed toward a MIM device (e.g., MIM capacitor) with improved performance. The MIM device comprises a first metal plate, a second metal plate disposed over the first metal plate, and a third metal plate disposed over the second metal plate. A first capacitor insulator structure is disposed between the first metal plate and the second metal plate. The first capacitor insulator structure electrically insulates the first metal plate from the second metal plate. A second capacitor insulator structure is disposed between the second metal plate and the third metal plate. The second capacitor insulator structure electrically insulates the second metal plate from the third metal plate.

The first metal plate and the third metal plate are both electrically coupled to a first conductive contact (e.g., metal contact). The second metal plate is electrically coupled to a second conductive contact (e.g., metal contact). As such, for a given footprint (e.g., layout area penalty), the MIM device of the present disclosure may have a greater capacitance than a typical MIM device (e.g., due the MIM device of the present disclosure having an overall capacitance that is equal to a sum of the capacitance between the first metal plate and the second metal plate and the capacitance between the second metal plate and the third metal plate). Therefore, the MIM device of the present disclosure may have improved performance (e.g., increased capacitance for a given layout area) over the typical MIM device. Accordingly, the MIM device of the present disclosure may be utilized in some applications that typical MIM devices are not suitable (e.g., ICs with small single or dual pixel sizes).

Figure 1B:
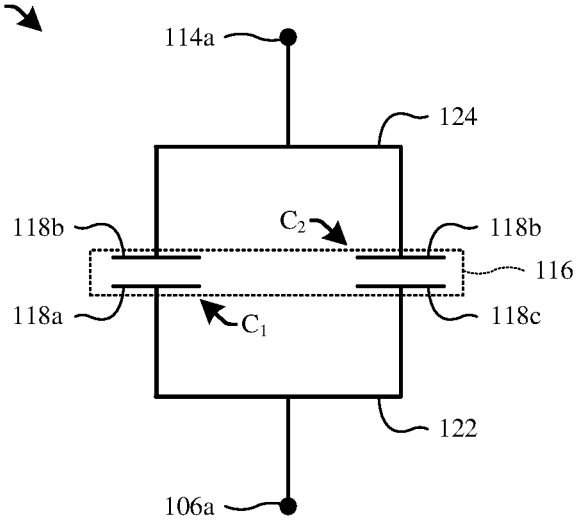

FIGS. 1A-1B illustrates various views 100a-100b of some embodiments of an integrated chip (IC) having a metal-insulator-metal (MIM) device 116 with improved performance. More specifically, FIG. 1A illustrates a cross-sectional view 100a of some embodiments of the IC having a MIM device with improved performance, and FIG. 1B illustrates a circuit diagram 100b of an equivalent circuit of the MIM device 116 illustrated in the cross-sectional view 100a of FIG. 1A.

As shown in the cross-sectional view 100a of FIG. 1A, a first inter-metal dielectric (IMD) structure 104 overlies a substrate 102. The substrate 102 comprises any type of semiconductor body (e.g., monocrystalline silicon/CMOS bulk, germanium (Ge), silicon-germanium (SiGe), a III-V semiconductor, silicon on insulator (SOI), etc.). The first IMD structure 104 comprise one or more stacked IMD layers, which may respectively comprise a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. While not shown, it will be appreciated that any number of semiconductor devices (e.g., metal-oxide-semiconductor field-effect transistors (MOSFETs)) may be disposed on/over the substrate 102.

A first interconnect structure 106 (e.g., copper interconnect) is embedded in the first IMD structure 104 and overlies the substrate 102. The first interconnect structure 106 comprises a plurality of conductive features (e.g., metal wires, metal vias, metal contacts, etc.). For example, the first interconnect structure 106 comprises a first conductive feature 106a (e.g., a copper wire). The plurality of conductive features may be or comprise, for example, copper (Cu), aluminum (Al), gold (Au), silver (Ag), some other conductive material, or a combination of the foregoing. The first interconnect structure 106 is configured to electrically couple the semiconductor devices of the IC together in a predefined manner.

A first dielectric structure 108 is disposed over the first IMD structure 104 and the substrate 102. In some embodiments, an upper surface of the first dielectric structure 108 is substantially planar (e.g., flat). The first dielectric structure 108 may be, for example, an oxide (e.g., $SiO_2$), a nitride (e.g., SiN), an oxy-nitride (e.g., SiON), a low-k dielectric, doped silicon dioxide (e.g., carbon doped silicon dioxide) USG, BSG, PSG, BPSG, FSG, some other dielectric material, or a combination of the foregoing. In some embodiments, the first dielectric structure 108 is silicon dioxide ($SiO_2$). In further embodiments, the first dielectric structure 108 has a same chemical composition as a nearest one of the IMD layers of the first IMD structure 104. In other words, the first dielectric structure 108 and the nearest one of the IMD layers of the first IMD structure 104 are a same material. In other embodiments, the first dielectric structure 108 has a different chemical composition than the nearest one of the IMD layers of the first IMD structure 104 (e.g., the first dielectric structure 108 is $SiO_2$ and the nearest one of the IMD layers of the first IMD structure 104 is a low-k dielectric material).

A second dielectric structure 110 is disposed over the first dielectric structure 108 and the substrate 102. In some embodiments, an upper surface of the second dielectric structure 110 is substantially planar (e.g., flat). The second dielectric structure 110 may be, for example, an oxide (e.g., $SiO_2$), a nitride (e.g., SiN), an oxy-nitride (e.g., SiON), a low-k dielectric, doped silicon dioxide (e.g., carbon doped silicon dioxide) USG, BSG, PSG, BPSG, FSG, some other dielectric material, or a combination of the foregoing. In some embodiments, the second dielectric structure 110 is silicon dioxide ($SiO_2$). In further embodiments, the second dielectric structure 110 has a same chemical composition as first dielectric structure 108 (e.g., both the first dielectric structure 108 and the second dielectric structure 110 are $SiO_2$). In other embodiments, the second dielectric structure 110 has a different chemical composition than the first dielectric structure 108.

A second IMD structure 112 is disposed over the second dielectric structure 110 and the substrate 102. The second IMD structure 112 comprises one or more stacked IMD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), doped silicon dioxide (e.g., carbon doped silicon dioxide), USG, BSG, PSG, BPSG, FSG, or the like. A second interconnect structure 114 (e.g., copper interconnect) is embedded in the second IMD structure 112 and overlies the substrate 102. The second interconnect structure 114 comprises a plurality of conductive features (e.g., metal wires, metal vias, etc.). For example, the second interconnect structure 114 comprises a first conductive feature 114a (e.g., a copper wire). The plurality of conductive features may be or comprise, for example, copper (Cu), aluminum (Al), gold (Au), silver (Ag), some other conductive material, or a combination of the foregoing. In some embodiments, the conductive features of the second interconnect structure 114 are electrically coupled to the conductive features of the first interconnect structure 106. In other words, the first interconnect structure 106 and the second interconnect structure 114 are portions of a larger interconnect structure that is configured to electrically couple the semiconductor devices of the IC in a predefined manner.

A metal-insulator-metal (MIM) device 116 is disposed vertically between the first IMD structure 104 and the second IMD structure 112. The first dielectric structure 108 is disposed over the MIM device 116. The MIM device comprises a plurality of metal plates 118 and a plurality of capacitor insulator structures 120.

The plurality of metal plates 118 comprises at least three (3) metal plates. For example, the plurality of metal plates 118 comprises a first metal plate 118a, a second metal plate 118b, and a third metal plate 118c. The plurality of metal plates are vertically spaced from one another. For example, the first metal plate 118a is vertically spaced from the second metal plate 118b, and the second metal plate 118b is vertically spaced from the third metal plate 118c. The plurality of metal plates 118 are conductive and may be or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, each of the plurality of metal plates 118 are or comprise a same material. For example, in some embodiments, the first metal plate 118a, the second metal plate 118b, and the third metal plate 118c are each titanium nitride (TiN).

The plurality of capacitor insulator structures 120 comprise at least two (2) capacitor insulator structures. For example, the plurality of capacitor insulator structures 120 comprises a first capacitor insulator structure 120a and a second capacitor insulator structure 120b. The plurality of capacitor insulator structures 120 comprises one less capacitor insulator structure than the plurality of metal plates 118 comprise metal plates. For example, as shown in the cross-sectional view 100a of FIG. 1A, the plurality of metal plates 118 comprises three (3) metal plates (e.g., the first metal plate 118a, the second metal plate 118b, and the third metal plate 118*c*) and the plurality of capacitor insulator structures 120 comprises two (2) capacitor insulator structures (e.g., the first capacitor insulator structure 120*a* and the second capacitor insulator structure 120*b*).

The plurality of capacitor insulator structures 120 may be or comprise, for example, zirconium oxide ($ZrO_2$), aluminum oxide ($Al_2O_3$), hafnium oxide ($HfO_2$), hafnium aluminum oxide (HfAlO), tantalum oxide ($Ta_2O_5$), some other dielectric material, or any combination of the foregoing. In some embodiments, the plurality of capacitor insulator structures 120 are or comprise a metal oxide (e.g., $ZrO_2$, $Al_2O_3$, $HfO_2$, HfAlO, $Ta_2O_5$, or the like) and/or are or comprise a high-k dielectric material. A high-k dielectric material is a dielectric material having a dielectric constant greater than about 3.9, or some other suitable value. In some embodiments, each of the plurality of capacitor insulator structures 120 are or comprise a same material.

Each of the plurality of capacitor insulator structures 120 are disposed between and electrically isolate neighboring metal plates of the plurality of metal plates 118. For example, the first metal plate 118*a* neighbors the second metal plate 118*b*, and the third metal plate 118*b* neighbors the second metal plate 118*b*. The first capacitor insulator structure 120*a* is disposed between (vertically between) the first metal plate 118*a* and the second metal plate 118*b*. The first capacitor insulator structure 120*a* also electrically isolates the first metal plate 118*a* from the second metal plate 118*b*. The second capacitor insulator structure 120*b* is disposed between (vertically between) the second metal plate 118*b* and the third metal plate 118*c*. The second capacitor insulator structure 120*b* also electrically isolates the second metal plate 118*b* from the third metal plate 118*c*.

A first group of metal plates of the plurality of metal plates 118 are electrically coupled together. The first group of metal plates comprises a lowermost plate of the plurality of metal plates 118. Further, a second group of metal plates of the plurality of metal plates 118 are electrically coupled together. The first group of metal plates are electrically isolated from the second group of metal plates. The metal plates of the first group of metal plates and the metal plates of the second group of metal plates are vertically stacked and alternate back and forth from a lowermost metal plate of the plurality of metal plates 118 to an uppermost metal plate of the plurality of metal plates.

For example, the first group of metal plates comprises the first metal plate 118*a* and the third metal plate 118*c*. The second group of metal plates comprises the second metal plate 118*b*. The first metal plate 118*a* is electrically coupled to the third metal plate 118*c*. In some embodiments, the first metal plate 118*a* is the lowermost metal plate of the plurality of metal plates 118. In further embodiments, the third plate 118*c* is the uppermost metal plate of the plurality of metal plates 118. The first metal plate 118*a*, the second metal plate 118*b*, and the third metal plate 116*c* are vertically stacked. The second metal plate 118*b* is disposed vertically between the first metal plate 118*a* and the third metal plate 118*c*. The second metal plate 118*b* neighbors both the first metal plate 118*a* and the third metal plate 118*c*.

A first conductive contact 122 electrically couples the first group of metal plates together. For example, the first conductive contact 122 electrically couples the first metal plate 118*a* to the third metal plate 118*c*. The first conductive contact 122 is disposed in the first dielectric structure 108. In some embodiments, an upper surface of the first conductive contact 122 is co-planar with an upper surface of the first dielectric structure 108. The first conductive contact 122 may be or comprise, for example, copper (Cu), aluminum (Al), gold (Au), silver (Ag), some other conductive material, or a combination of the foregoing. In some embodiments, the first conductive contact 122 is or comprises a same material as the first conductive feature 106*a* of the first interconnect structure 106 and/or the first conductive feature 114*a* of the second interconnect structure 114. Because the first conductive contact 122 electrically couples the first group of metal plates together, and because the first conductive feature 106*a* of the first interconnect structure 106*a* is electrically coupled to the lowermost plate (e.g., the first metal plate 118*a*) of the plurality of metal plates 118, each of the metal plates of the first group of metal plates are electrically coupled to the first conductive feature 106*a* of the first interconnect structure 106.

A conductive via 124 electrically couples the second group of metal plates to the first conductive feature 114*a* of the second interconnect structure 114. For example, as shown in the cross-sectional view 100*a* of FIG. 1A, the second group of metal plates comprises the second metal plate 118*b*. The conductive via 124 electrically couples the second metal plate 118*b* to the the first conductive feature 114*a* of the second interconnect structure 114. In some embodiments, because the second metal plate 118*b* makes up the second group of metal plates, and because the conductive via 124 electrically couples the second metal plate 118*b* to the first conductive feature 114*a* of the second interconnect structure 114, each of the metal plates of the second group of metal plates are electrically coupled to the first conductive feature 114*a* of the second interconnect structure 114.

The conductive via 124 extends vertically (e.g., in a substantially vertical line) through both the first dielectric structure 108 and the second dielectric structure 110 to electrically couple the second group of metal plates to the first conductive feature 114*a* of the second interconnect structure 114. The conductive via 124 may be or comprise, for example, copper (Cu), aluminum (Al), gold (Au), silver (Ag), some other conductive material, or a combination of the foregoing. In some embodiments, the conductive via 124 has an upper surface that is co-planar with an upper surface of the second dielectric structure 110.

As shown in the circuit diagram 100*b* of FIG. 1B, the equivalent circuit of the MIM device 116 comprises a first capacitor $C_1$ and a second capacitor $C_2$. The first capacitor $C_1$ corresponds to the first metal plate 118*a* and the second metal plate 118*b* being spaced from one another by the first capacitor insulator structure 120*a*. The second capacitor $C_2$ corresponds to the second metal plate 118*b* and the third metal plate 118*c* being spaced from one another by the second capacitor insulator structure 120*b*. The first capacitor $C_1$ and the second capacitor $C_2$ are connected in parallel. The first capacitor $C_1$ and the second capacitor $C_2$ are connected in parallel due to each of the metal plates of the first group of metal plates being electrically coupled to the first conductive feature 106*a* of the first interconnect structure 106, and due to each of the metal plates of the second group of metal plates being electrically coupled to the first conductive feature 114*a* of the second interconnect structure 114. More specifically, the first metal plate 118*a* and the third metal plate 118*c* are electrically coupled together via the first conductive contact 122 and define the first group of metal plates. Further, the first metal plate 118*a* is electrically coupled to the first conductive contact 106*a* of the first interconnect structure 106. Moreover, the second metal plate 116*b* defines the second group of metal plates and is electrically coupled to the first conductive feature 114a of the second interconnect structure 114 via the conductive via 124.

Therefore, for a given footprint (e.g., layout area penalty), the MIM device 116 may have a greater capacitance than a typical MIM device (e.g., due the MIM device 116 having an overall capacitance that is equal to the sum of a capacitance of the first capacitor $C_1$ and a capacitance of the second capacitor $C_2$). Thus, the MIM device 116 may have improved performance (e.g., increased capacitance for a given layout area) over the typical MIM device. Accordingly, the MIM device 116 may be utilized in some applications that typical MIM devices are not suitable (e.g., ICs with small single or dual pixel sizes).

Figure 2A:
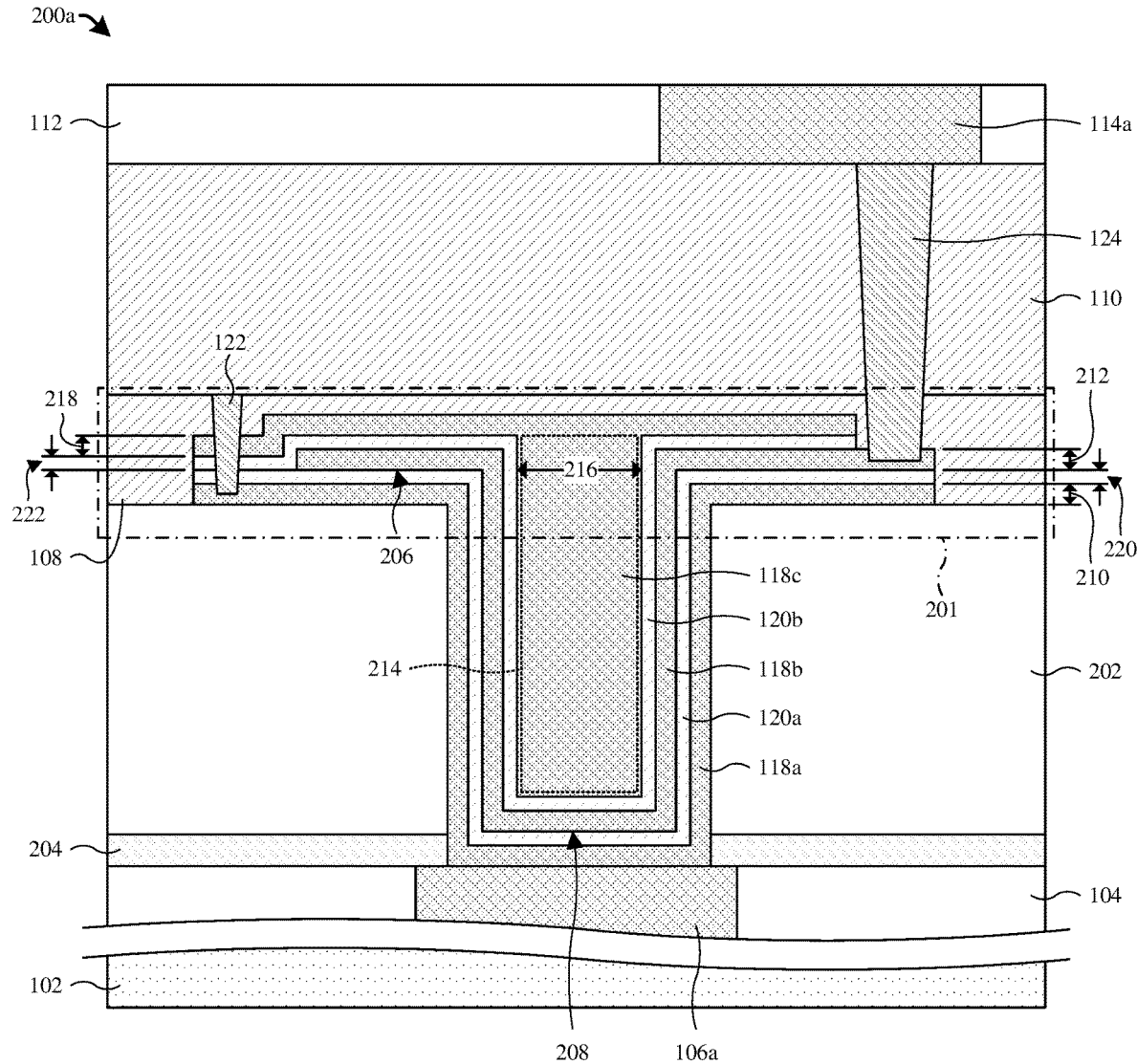
FIGS. 2A-2B illustrates various views of some more detailed embodiments of the IC of FIGS. 1A-1B.
Figure 2B:
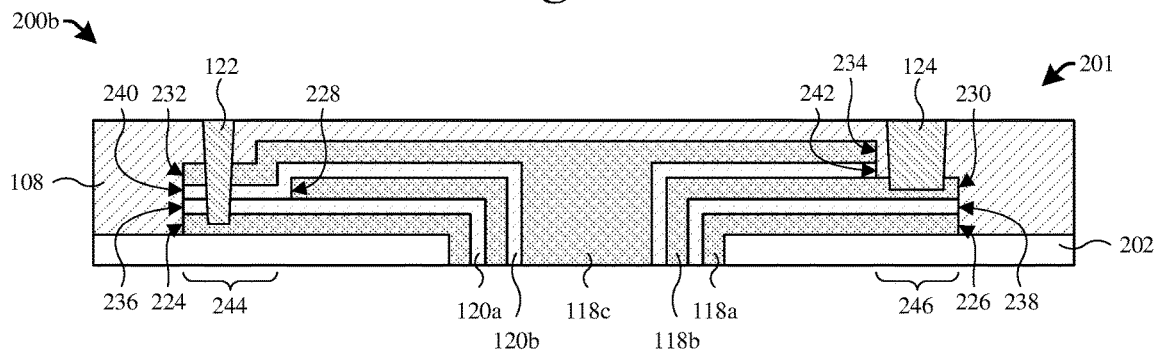

FIGS. 2A-2B illustrates various views 200a-200b of some more detailed embodiments of the IC of FIGS. 1A-1B. More specifically, FIG. 2A illustrates a cross-sectional view 200a of some more detailed embodiments of the IC of FIGS. 1A-1B, and FIG. 2B illustrates an inset view 200b of an area 201 of the IC illustrated in the cross-sectional view 200a of FIG. 2A.

As shown in the various views 200a-200b of FIGS. 2A-2B, a third IMD structure 202 is disposed vertically between the first IMD structure 104 and the first dielectric structure 108. The third IMD structure 202 comprises one or more stacked IMD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), doped silicon dioxide (e.g., carbon doped silicon dioxide), USG, BSG, PSG, BPSG, FSG, or the like. In some embodiments, the third IMD structure 202 is a single IMD layer. In further embodiments, the third IMD structure 202 has a substantially planar upper surface.

In some embodiments, an etch stop layer 204 is disposed vertically between the third IMD structure 202 and the first IMD structure 104. In other embodiments, the etch stop layer 204 is omitted. The etch stop layer 204 vertically separates the third IMD structure 202 from the first IMD structure 104. The etch stop layer 204 is a different material than both the third IMD structure 202 and the first IMD structure 104. The etch stop layer 204 may be or comprise, for example, a nitride (e.g., SiN), an oxy-nitride (e.g., SiON), a carbide (e.g., silicon carbide (SiC)), or the like.

Each of the plurality of metal plates 118 and each of the capacitor insulator structures 120 are disposed partially below and partially over (above) an uppermost surface of the third IMD structure 202. In other words, each of the plurality of metal plates 118 and each of the capacitor insulator structures 120 vertically extend into the third IMD structure 202 from above the uppermost surface of the third IMD structure 202. In some embodiments, the first metal plate 118a also extends vertically through the etch stop layer 204.

Each of the metal plates 118 also have a first lower surface that is disposed over (above) the uppermost surface of the third IMD structure 202 and a second lower surface disposed below the uppermost surface of the third IMD structure 202. For example, the second metal plate 118b has a first lower surface 206 that is disposed over the uppermost surface of the third IMD structure 202 and a second lower surface 208 that is disposed below the uppermost surface of the third IMD structure 202. Further, like the plurality of metal plates 118, each of the capacitor insulator structures 120 also have a first lower surface that is disposed over (above) the uppermost surface of the third IMD structure 202 and a second lower surface disposed below the uppermost surface of the third IMD structure 202.

The first metal plate 118a has a first thickness 210. The first thickness 210 may be between about 30 angstroms (Å) and about 1000 Å. The second metal plate 118b has a second thickness 212. The second thickness 212 is between about 50 Å and about 2000 Å.

The third metal plate 118c comprises a central portion 214 and an upper portion. The upper portion of the third metal plate 118c overlies and extends laterally beyond the central portion 214 of the third metal plate 118c. The central portion 214 of the third metal plate 118c is disposed partially below and partially over (above) the uppermost surface of the third IMD structure 202.

The central portion 214 of the third metal plate 118c has a third thickness 216. The third thickness is between about 60 Å and about 2000 Å. The upper portion of the third metal plate 118c has a fourth thickness 218. The fourth thickness 218 is between about 30 Å and about 1000 Å. In some embodiments, the third thickness 216 is greater than the fourth thickness 218. In further embodiments, the third thickness 216 is about twice (e.g., two times) the fourth thickness 218 (e.g., due to a method for forming the third metal plate 118c having good step coverage).

In some embodiments, the first thickness 210 is substantially the same as the fourth thickness 218. In some embodiments, the second thickness 212 is greater than both the first thickness 210 and the fourth thickness 218. In other embodiments, the second thickness 212, the first thickness 210, and the fourth thickness 218 are substantially the same.

The first capacitor insulator structure 120a has a fifth thickness 220. The fifth thickness 220 may be between about 10 Å and about 300 Å. The second capacitor insulator structure 120b has a sixth thickness 222. The sixth thickness 222 may be between about 10 Å and about 300 Å. In some embodiments, the fifth thickness 220 is substantially the same as the sixth thickness 222. In other embodiments, the fifth thickness 220 is different than the sixth thickness 222. A sum of the first thickness 210, the second thickness 212, the fourth thickness 218, the fifth thickness 220, and the sixth thickness 222 may be between about 130 Å and about 4600 Å.

Also shown in the various views 200a-200b of FIGS. 2A-2B, the first metal plate 118a has a first sidewall 224 and a second sidewall 226. The second sidewall 226 of the first metal plate 118a is opposite the first sidewall 224 of the first metal plate 118a. Further, the second metal plate 118b has a first sidewall 228 and a second sidewall 230. The second sidewall 230 of the second metal plate 118b is opposite the first sidewall 228 of the second metal plate 118b. Moreover, the third metal plate 118c has a first sidewall 232 and a second sidewall 234. The second sidewall 234 of the third metal plate 118c is opposite the first sidewall 232 of the third metal plate 118c.

The first sidewall 228 of the second metal plate 118b is laterally offset from both the first sidewall 224 of the first metal plate 118a and the first sidewall 232 of the third metal plate 118c in a first direction. The second sidewall 230 of the second metal plate 118b is aligned (along a first vertical plane) with the second sidewall 226 of the first metal plate 118a. The first sidewall 232 of the third metal plate 118c is aligned (along a second vertical plane) with the first sidewall 224 of the first metal plate 118a. The second sidewall 234 of the third metal plate 118c is laterally offset from both the second sidewall 226 of the first metal plate 118a and the second sidewall 230 of the second metal plate 118b in a second direction that is opposite the first direction.

The first capacitor insulator structure 120a has a first sidewall 236 and a second sidewall 238. The second sidewall 238 of the first capacitor insulator structure 120a is opposite the first sidewall 236 of the first capacitor insulator structure 120a. Further, the second capacitor insulator structure 120b has a first sidewall 240 and a second sidewall 242. The second sidewall 242 of the second capacitor insulator structure 120b is opposite the first sidewall 240 of the second capacitor insulator structure 120b.

The first sidewall 236 of the first capacitor insulator structure 120a is aligned (along the second vertical plane) with the first sidewall 240 of the second capacitor insulator structure 120b. In some embodiments, the first sidewall 224 of the first metal plate 118a, the first sidewall 232 of the third metal plate 118c, the first sidewall 236 of the first capacitor insulator structure 120a, and the first sidewall 240 of the second capacitor insulator structure 120b are aligned (along the second vertical plane). In further embodiments, the first sidewall 228 of the second metal plate 118b is laterally offset in the first direction from each of the first sidewall 224 of the first metal plate 118a, the first sidewall 232 of the third metal plate 118c, the first sidewall 236 of the first capacitor insulator structure 120a, and the first sidewall 240 of the second capacitor insulator structure 120b.

The second sidewall 242 of the second capacitor insulator structure 120b is laterally offset in the second direction from the second sidewall 238 of the first capacitor insulator structure 120a. In some embodiments, the second sidewall 242 of the second capacitor insulator structure 120b is laterally offset in the second direction from both the second sidewall 226 of the first metal plate 118a and the second sidewall 230 of the second metal plate 118b. In some embodiments, the second sidewall 242 of the second capacitor insulator structure 120b is aligned (along a third vertical plane) with the second sidewall 234 of the third metal plate 120c. In some embodiments, the second sidewall 238 of the first capacitor insulator structure 120a is aligned (along the first vertical plane) with both the second sidewall 226 of the first metal plate 118a and the second sidewall 230 of the second metal plate 118b.

A first portion of the first capacitor insulator structure 120a is disposed laterally between the first sidewall 228 of the second metal plate 118b and the first sidewall 224 of the first metal plate 118a. A portion of the second capacitor insulator structure 120b is disposed laterally between the first sidewall 228 of the second metal plate 118b and the first sidewall 224 of the first metal plate 118a. The portion of the second capacitor insulator structure 120b overlies (directly overlies) the first portion of the first capacitor insulator structure 120a. The first portion of the first capacitor insulator structure 120a overlies (directly overlies) a first portion of the first metal plate 118a. A portion of the third metal plate 118c overlies (directly overlies) the portion of the second capacitor insulator structure 120b. Both the first portion of the first capacitor insulator structure 120a and the portion of the second capacitor insulator structure 120b vertically separate the first portion of the first metal plate 118a from the portion of the third metal plate 118c.

The portion of the third metal plate 118c defines a first landing area 244. The first conductive contact 122 is disposed with a perimeter of the first landing area 244. It will be appreciated that the first landing area 244 extends not only in both the first direction and the second direction, but also in both a third direction and a fourth direction that are transverse (e.g., extend into and out of the page) to both the first direction and the second direction (e.g., extend left and right across the page). Because the first conductive contact 122 is disposed with the perimeter of the first landing area 244, the first conductive contact 122 may extend in a substantially vertical line through the portion of the third metal plate 118c, the portion of the second capacitor insulator structure 120b, the first portion of the first capacitor insulator structure 120a, and into the first portion of the first metal plate 118a, such that the first conductive contact 122 is electrically coupled to both the first metal plate 118a and the third metal plate 118c (e.g., the first group of metal plates) and electrically isolated from the second metal plate 118b (e.g., the second group of metal plates).

The second sidewall 242 of the second capacitor insulator structure 120b and the second sidewall of the 234 of the third metal plate 118c are laterally offset in the second direction from each of the second sidewall 226 of the first metal plate 118a, the second sidewall 230 of the second metal plate 118b, and the second sidewall 238 of the first capacitor insulator structure 120a. As such, a portion of the second metal plate 118b is disposed laterally between the second sidewall 230 of the second metal plate 118b and the second sidewall of the 234 of the third metal plate 118c, a second portion of the first capacitor insulator structure 120a is disposed laterally between the second sidewall 238 of the first capacitor insulator structure 120a and the second sidewall of the 234 of the third metal plate 118c, and a second portion of the first metal plate 118a is disposed laterally between the second sidewall 226 of the first metal plate 118a and the second sidewall of the 234 of the third metal plate 118c. The second portion of the first capacitor insulator structure 120a overlies (directly overlies) the second portion of the first metal plate 118a, and the portion of the second metal plate 118b overlies (directly overlies) the second portion of the first capacitor insulator structure 120a.

The portion of the second metal plate 118b defines a second landing area 246. The conductive via 124 (or some other conductive feature) is disposed with a perimeter of the second landing area 246. It will be appreciated that the second landing area 246 extends not only in both the first direction and the second direction (e.g., left and right across the page), but also in both the third direction and the fourth direction (e.g., in and out of the page). Because the conductive via 124 is disposed with the perimeter of the second landing area 246, the conductive via 124 may extend through the first dielectric structure 108 in a substantially vertical line to the portion of the second metal plate 118b, such that the conductive via 124 is electrically coupled to the second metal plate 118b (e.g., the second group of metal plates) and electrically isolated from both the first metal plate 118a and the third metal plate 118c (e.g., the first group of metal plates).

Figure 3:
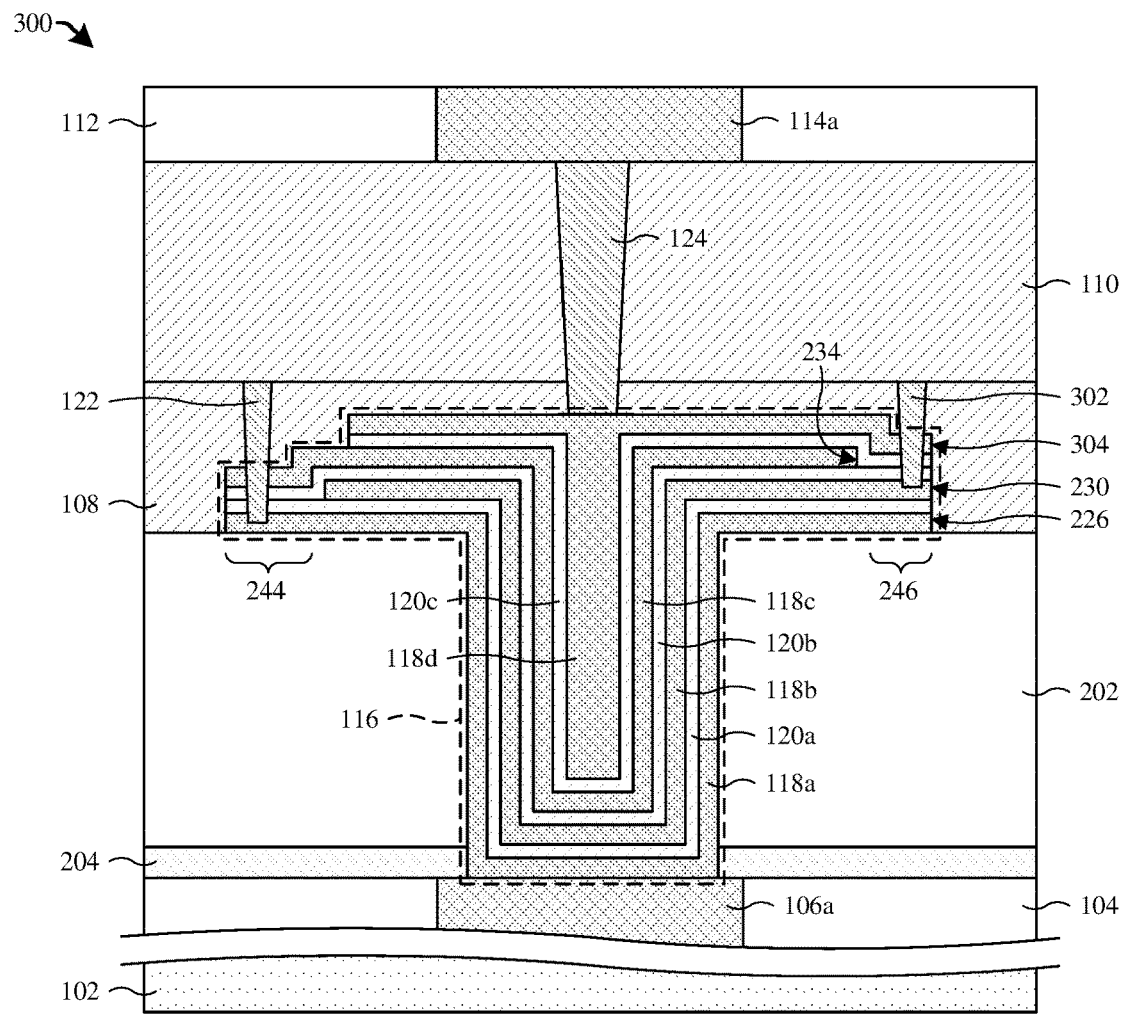
FIG. 3 illustrates a cross-sectional view of some other embodiments of the IC of FIGS. 2A-2B.

FIG. 3 illustrates a cross-sectional view 300 of some other embodiments of the IC of FIGS. 2A-2B.

As shown in the cross-sectional view 300 of FIG. 3, the plurality of metal plates 118 comprises four (4) metal plates. For example, the plurality of metal plates 118 comprises the first metal plate 118a, the second metal plate 118b, the third metal plate 118c, and a fourth metal plate 118d. The fourth metal plate 118d overlies the third metal plate 118c. In some embodiments, the fourth metal plate 118d is an uppermost metal plate of the plurality of metal plates 118.

The plurality of capacitor insulator structures 120 comprises three (3) capacitor insulator structures. For example, the plurality of capacitor insulator structures 120 comprises the first capacitor insulator structure 120a, the second capacitor insulator structure 120b, and a third capacitor insulator structure 120c. The third capacitor insulator structure 120c overlies the second capacitor insulator structure 120b. The third capacitor insulator structure 120c is disposed (vertically) between the third metal plate 118c and the fourth metal plate 118d. The third capacitor insulator structure 120c electrically isolates the third metal plate 118c from the fourth metal plate 118d.

A first group of metal plates of the plurality of metal plates 118 are electrically coupled together. The first group of metal plates comprises a lowermost plate of the plurality of metal plates 118. Further, a second group of metal plates of the plurality of metal plates 118 are electrically coupled together. The first group of metal plates are electrically isolated from the second group of metal plates. The metal plates of the first group of metal plates and the metal plates of the second group of metal plates are vertically stacked and alternate back and forth from the lowermost metal plate of the plurality of metal plates 118 to an uppermost metal plate of the plurality of metal plates. For example, the first group of metal plates comprises the first metal plate 118a and the third metal plate 118c, and the second group of metal plates comprises the second metal plate 118b and the fourth metal plate 118d. The first group of metal plates of the plurality of metal plates 118 are electrically coupled together by the first conductive contact 122.

Also shown in the cross-sectional view 300 of FIG. 3, a second conductive contact 302 electrically couples the second group of metal plates together. For example, the second conductive contact 302 electrically couples the second metal plate 118b to the fourth metal plate 118d. The second conductive contact 302 is disposed in the first dielectric structure 108 and electrically isolated from the first conductive contact 122. In some embodiments, an upper surface of the second conductive contact 302 is co-planar with the upper surface of the first dielectric structure 108 (and the upper surface of the first conductive contact 122). The second conductive contact 302 may be or comprise, for example, copper (Cu), aluminum (Al), gold (Au), silver (Ag), some other conductive material, or a combination of the foregoing. In some embodiments, the second conductive contact 302 is or comprises a same material as the first conductive contact 122.

Further, the conductive via 124 is electrically coupled to the fourth metal plate 118d. In some embodiments, the fourth metal plate 118d is an uppermost metal plate of the plurality of metal plates 118. In other words, in some embodiments, the conductive via 124 is electrically coupled to the uppermost metal plate of the plurality of metal plates 118. The conductive via 124 electrically couples the fourth metal plate 118d to the first conductive feature 114a of the second interconnect structure 114. Because the second conductive contact 302 electrically couples the second group of metal plates together, and because the conductive via 124 electrically couples the fourth metal plate 118d to the first conductive feature 114a of the second interconnect structure 114, each of the metal plates of the second group of metal plates are electrically coupled to the first conductive feature 114a of the second interconnect structure 114.

The second conductive contact 302 is disposed within the perimeter of the second landing area 246. In the IC of FIG. 3, the second landing area 246 is defined by a portion of the fourth metal plate 114d. The portion of the fourth metal plate 114d defines the second landing area 246 due to a sidewall 304 of the fourth metal plate 118d being laterally offset from the second sidewall 234 of the third metal plate 118c in the first direction, and due to each of the sidewall 304 of the fourth metal plate 118d, the second sidewall 230 of the second metal plane 118b, and the second sidewall 226 of the first metal plate 118a being aligned (along the first vertical plane). As such, a portion of the fourth metal plate 114d is disposed laterally between the sidewall 304 of the fourth metal plate 118d and the second sidewall 234 of the third metal plate 118c, and overlies (directly overlies) the portion of the second metal plate 118b. Therefore, because the second conductive contact 302 is disposed with the perimeter of the second landing area 246, the second conductive contact 302 may extend in a substantially vertical line through the portion of the fourth metal plate 118d, a portion of the third capacitor insulator structure 120c (which overlies (directly overlies) the portion of the second metal plate 118b), and into the portion of the second metal plate 118b, such that the second conductive contact 302 is electrically coupled to both the fourth metal plate 118d and the second metal plate 118b (e.g., the second group of metal plates) and electrically isolated from both the first metal plate 118a and the third metal plate 118c (e.g., the first group of metal plates).

While the IC of FIG. 3 illustrates the plurality of metal plates 118 comprising four metal plates, it will be appreciated that the plurality of metal plates 118 may comprise N plates, where N is any whole number greater than or equal to three (3). It will also be appreciated that the plurality of capacitor insulator structures 120 comprise N−1 (N minus one) capacitor insulator structures. It will further be appreciated that regardless of the value of N, the plurality of metal plates 118 and the plurality of capacitor insulator structures 120 are stacked in a substantially similar manner as illustrated in the cross-sectional view 400 of FIG. 4, such that the first landing area 244 and the second landing area 246 are of sufficient size so that conductive features may safely (e.g., not having unwanted electrically shorts) couple the first group of metal plates together and the second group of metal plates together, while ensuring electrical isolation between the first group of metal plates and the second group of metal plates.

Figure 4:
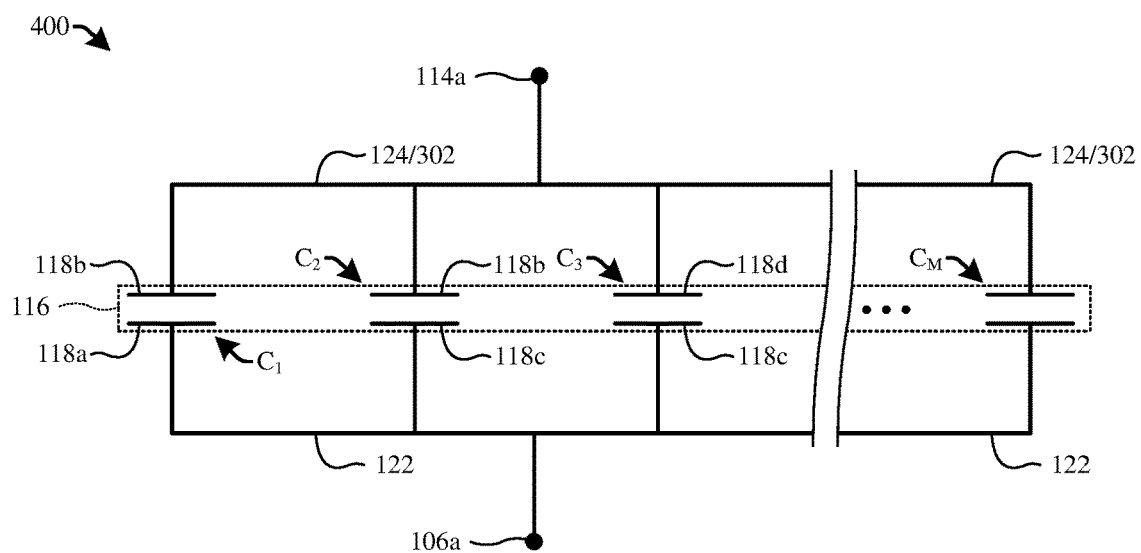
FIG. 4 illustrates a circuit diagram of an equivalent circuit of some embodiments of the MIM device of FIG. 3.

FIG. 4 illustrates a circuit diagram 400 of an equivalent circuit of some embodiments of the MIM device 116 of FIG. 3.

As shown in the circuit diagram 400 of FIG. 4, an equivalent circuit of some embodiments of the MIM device 116 of FIG. 3 comprises a first capacitor $C_1$, a second capacitor $C_2$, and a third capacitor $C_3$. The first capacitor $C_1$ corresponds to the first metal plate 118a and the second metal plate 118b being spaced from one another by the first capacitor insulator structure 120a. The second capacitor $C_2$ corresponds to the second metal plate 118b and the third metal plate 118c being spaced from one another by the second capacitor insulator structure 120b. The third capacitor $C_3$ corresponds to the third metal plate 118c and the fourth metal plate 118d being spaced from one another by the third capacitor insulator structure 120c. The first capacitor $C_1$, the second capacitor $C_2$, and the third capacitor $C_3$ are connected in parallel.

The first capacitor $C_1$, the second capacitor $C_2$, and the third capacitor $C_3$ are connected in parallel due to each of the metal plates of the first group of metal plates being electrically coupled to the first conductive feature 106a of the first interconnect structure 106, and due to each of the metal plates of the second group of metal plates being electrically coupled to the first conductive feature 114a of the second interconnect structure 114. More specifically, the first metal plate 118a and the third metal plate 118c are electrically coupled together via the first conductive contact 122 and define the first group of metal plates. Further, the first metal plate 118a is electrically coupled to the first conductive contact 106a of the first interconnect structure 106. Moreover, the second metal plate 118b and the fourth metal plate 118d are electrically coupled together via the second conductive contact 302 and define the second group of metal plates. In addition, the fourth metal plate 118d is electrically coupled to the first conductive contact 114a of the second interconnect structure 114 (e.g., via the second conductive contact 302 and the conductive via 124). It will be appreciated that the MIM device 116 may comprise M capacitors $C_M$, where M is any whole number greater than two (2). It will also be appreciated that the ellipsis ( . . . ) illustrated in the circuit diagram 400 of FIG. 4 indicates that each of the M capacitors $C_M$ are connected in parallel (e.g., in parallel via the first conductive contact 122 and the second conductive contact 302).

Therefore, for a given footprint (e.g., layout area penalty), the MIM device 116 may have an even greater capacitance (e.g., greater than the capacitance of the MIM device 116 illustrated in FIGS. 1A-1B). Thus, a performance of the MIM device 116 may be further improved (e.g., increased capacitance for a given layout area). Moreover, because the MIM device 116 may comprise M capacitors $C_M$, the overall capacitance of the MIM device 116 may be tunable to a predefined capacitance (e.g., to a desired specification). Accordingly, the MIM device 116 may be utilized in an even larger number of applications.

FIGS. 5-14 illustrate a series of cross-sectional views 500-1400 of some embodiments of a method for forming an IC having a metal-insulator-metal MIM device 116 with improved performance. Although FIGS. 5-14 are described with reference to a method, it will be appreciated that the structures shown in FIGS. 5-14 are not limited to the method but rather may stand alone separate of the method.

Figure 5:
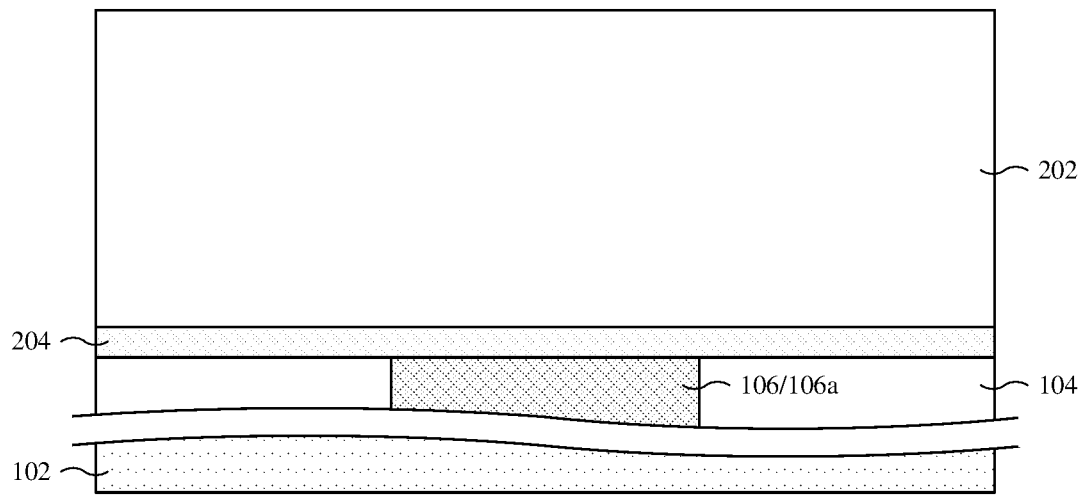
FIGS. 5-14 illustrate a series of cross-sectional views of some embodiments of a method for forming an IC having a metal-insulator-metal MIM device with improved performance.

As shown in cross-sectional view 500 of FIG. 5, a substrate 102 is provided and a first inter-metal dielectric (IMD) structure 104 is formed over the substrate 102. The first IMD structure 104 may be formed by, for example, chemical vapor deposition (CVD), physical vapor deposition (PVD), atomic layer deposition (ALD), some other deposition process, or a combination of the foregoing. A first interconnect structure 106 (e.g., copper interconnect) is formed over the substrate 102 and within the first IMD structure 104. The first interconnect structure 106 comprise a first conductive feature 106a. In some embodiments, the first interconnect structure 106 may be formed by, for example, a dual damascene process and/or a single damascene process. In further embodiments, the first interconnect structure 106 may be formed by, for example, CVD, PVD, ALD, sputtering, electrochemical plating, electroless plating, some other deposition process, or a combination of the foregoing. While not shown in the cross-sectional view 500 of FIG. 5, it will be appreciated that one or more semiconductor devices (e.g., transistors, MOSFETs, etc.), one or more interlayer dielectric (ILD) structures (e.g., low-k dielectric layers), one or more conductive contacts (e.g., metal contacts), or the like, may be formed before the first IMD structure 104 by known complementary metal-oxide-semiconductor (CMOS) processes.

Also shown in the cross-sectional view 500 of FIG. 5, in some embodiments, an etch stop layer 204 is then formed over the first IMD structure 104. The etch stop layer 204 may be formed by, for example, CVD, PVD, ALD, some other deposition process, or a combination of the foregoing. A third IMD structure 202 is then formed over the first IMD structure 104 (and the etch stop layer 204). The third IMD structure 202 may be formed by, for example, CVD, PVD, ALD, some other deposition process, or a combination of the foregoing.

Figure 6:
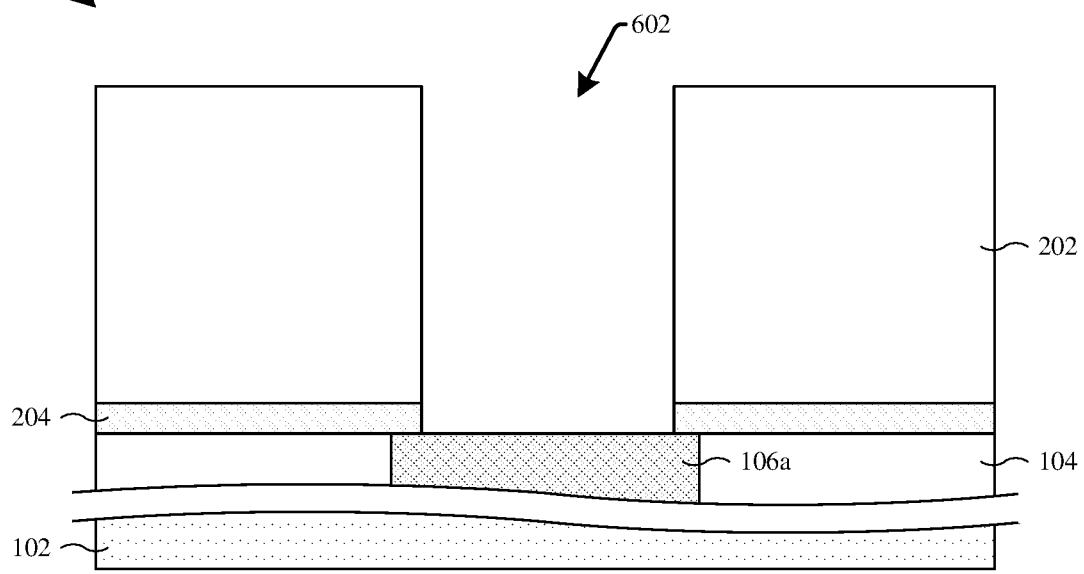

As shown in cross-sectional view 600 of FIG. 6, an opening 602 is formed in the third IMD structure 202 and the etch stop layer 204. The opening exposes the first conductive feature 106a of the first interconnect structure 106. In some embodiments, the opening 602 is formed with substantially vertical sidewalls. In other embodiments, the opening 602 is formed with angled sidewalls.

In some embodiments, a process for forming the opening 602 comprises forming a patterned masking layer (not shown) (e.g., positive/negative photoresist, a hardmask, etc.) on an upper surface of the third IMD structure 202. The patterned masking layer may be formed by forming a masking layer (not shown) on the upper surface of the third IMD structure 202 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the third IMD structure 202 and the etch stop layer 204 to selectively etch the third IMD structure 202 and the etch stop layer 204 according to the patterned masking layer. The etching process removes unmasked portions of the third IMD structure 202 and unmasked portions of the etch stop layer 204, thereby forming the opening 602. In some embodiments, the etching process may be, for example, a wet etching process, a dry etching process, a reactive ion etching (RIE) process, some other etching process, or a combination of the foregoing.

Figure 7:
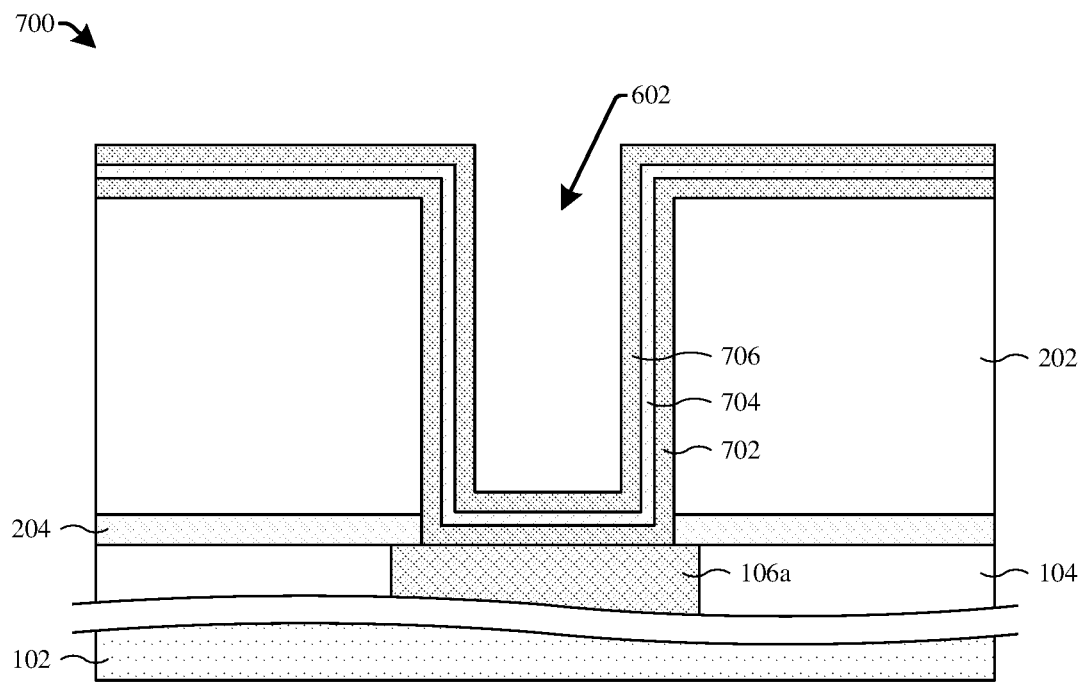

As shown in cross-sectional view 700 of FIG. 7, a first metal layer 702 is formed over the third IMD structure 202 and lining the opening 602. The first metal layer 702 is formed on the first conductive feature 106a of the first interconnect structure 106. In some embodiments, a process for forming the first metal layer 702 comprises depositing the first metal layer 702 on the third IMD structure 202 and in (e.g., lining) the opening 602. The first metal layer 702 may be deposited by, for example, ALD, CVD, PVD, electrochemical plating, electroless plating, sputtering, some other deposition process, or a combination of the foregoing. The first metal layer 702 is conductive and may be or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, the first metal layer 702 is deposited with a thickness between about 30 angstroms (Å) and about 1000 Å.

Thereafter, a first capacitor insulator layer 704 is formed on the first metal layer 702. The first capacitor insulator layer 704 may be or comprise, for example, zirconium oxide ($ZrO_2$), aluminum oxide ($Al_2O_3$), hafnium oxide ($HfO_2$), hafnium aluminum oxide (HfAlO), tantalum oxide ($Ta_2O_5$), some other dielectric material, or any combination of the foregoing. In some embodiments, the first capacitor insulator layer 704 is or comprises a metal oxide (e.g., $ZrO_2$, $Al_2O_3$, $HfO_2$, HfAlO, $Ta_2O_5$, or the like) and/or is or comprises a high-k dielectric material.

In some embodiments, a process for forming the first capacitor insulator layer 704 comprises depositing or growing the first capacitor insulator layer 704 on the first metal layer 704. The first capacitor insulator layer 704 may be deposited or grown by, for example, ALD, CVD, PVD, thermal oxidation, some other deposition or growth process, or a combination of the foregoing. In some embodiments, the first capacitor insulator layer 704 is formed with a thickness between about 10 Å and about 300 Å.

Thereafter, a second metal layer 706 is formed on the first capacitor insulator layer 704. In some embodiments, a process for forming the second metal layer 706 comprises depositing the second metal layer 706 on the first capacitor insulator layer 704. The second metal layer 706 may be deposited by, for example, ALD, CVD, PVD, sputtering, some other deposition process, or a combination of the foregoing. The second metal layer 706 is conductive and may be or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, the second metal layer 706 is the same material as the first metal layer 702. In further embodiments, the second metal layer 706 is deposited with a thickness between about 50 Å and about 2000 Å. In yet further embodiments, the thickness of the second metal layer 706 is greater than the thickness of the first metal layer 702.

Figure 8:
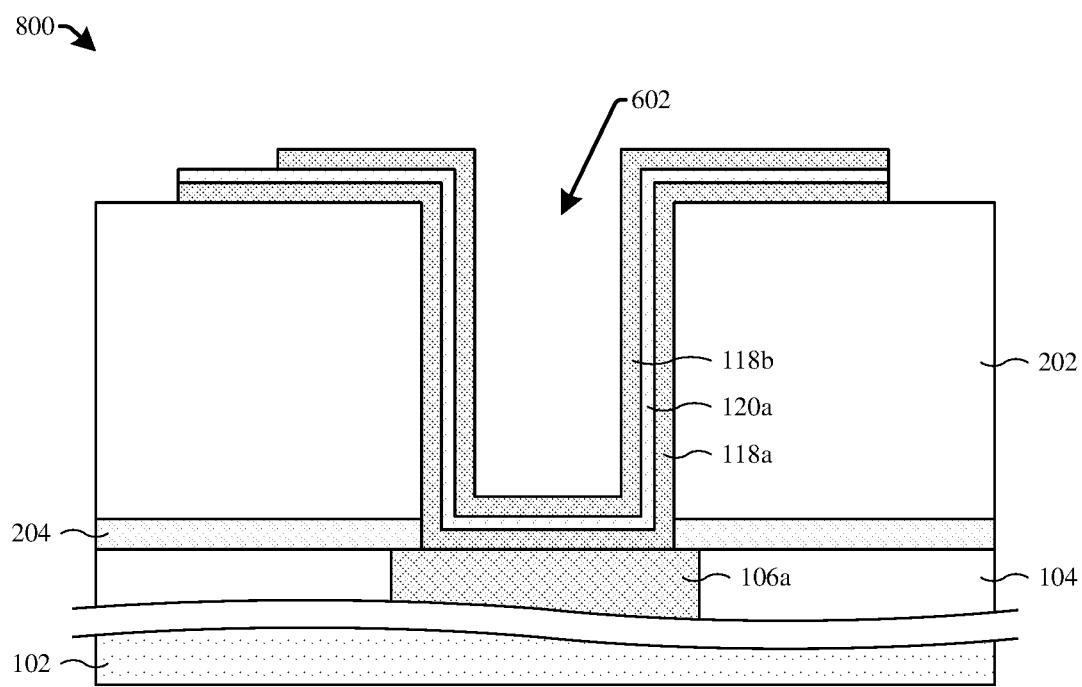

As shown in cross-sectional view 800 of FIG. 8, a first metal plate 118a, a first capacitor insulator structure 120a, and a second metal plate 118b are formed over the third IMD structure 202 and in the opening 602. The second metal plate 118b is formed over the first capacitor insulator layer 704 and the first metal layer 702 (see, e.g., FIG. 7).

In some embodiments, a process for forming the first metal plate 118a, the first capacitor insulator structure 120a, and the second metal plate 118b comprises forming a first patterned masking layer (not shown) (e.g., positive/negative photoresist, a hardmask, etc.) on/over the second metal layer 706 (see, e.g., FIG. 7) and in the opening 602. The first patterned masking layer may be formed by depositing a masking layer (not shown) on/over the second metal layer 706 (e.g., via a spin-on process), exposing the masking layer to a first pattern (e.g., via a lithography process, such as photolithography, extreme ultraviolet lithography, or the like), and developing the masking layer to form the first patterned masking layer.

Thereafter, with the first patterned masking layer in place, a first etching process is performed on the second metal layer 706 to selectively etch the second metal layer 706 according to the first patterned masking layer. The first etching process removes unmasked portions of the second metal layer 706, thereby leaving masked portions of the second metal layer 706 in place as the second metal plate 118b. In some embodiments, the first etching process may be, for example, a wet etching process, a dry etching process, a RIE process, some other etching process, or a combination of the foregoing. In further embodiments, the first etching process stops on the first capacitor insulator layer 704 (e.g., the first capacitor insulator layer 704 acts as an etch stop layer). In yet further embodiments, the first patterned masking layer is subsequently stripped away.

After the second metal plate 118b is formed, a second patterned masking layer (not shown) (e.g., positive/negative photoresist, a hardmask, etc.) is formed on/over the second metal plate 118b and on/over the first capacitor insulator layer 704. The second patterned masking layer may be formed in a substantially similar process as the first patterned masking layer. Thereafter, with the second patterned masking layer in place, a second etching process is performed on the first capacitor insulator layer 704 to remove unmasked portions of the first capacitor insulator layer 704, thereby leaving masked portions of the first capacitor insulator layer 704 in place as the first capacitor insulator structure 120a. In some embodiments, the second etching process may be, for example, a wet etching process, a dry etching process, a RIE process, some other etching process, or a combination of the foregoing. In further embodiments, the second patterned masking layer is subsequently stripped away.

In some embodiments, the second etching process is also performed on the first metal layer 702 to remove unmasked portions of the first metal layer 702, thereby leaving masked portions of the first metal layer 702 in place as the first metal plate 118a. In other embodiments, with the second patterned masking layer in place, a third etching process is performed on the first metal layer 702 to form the first metal plate 118a. In such embodiments, an etch chemistry of the third etching process is different than an eth chemistry of the second etching process. In further such embodiments, the etch chemistry of the third etching process may be the same as an etch chemistry of the first etching process.

Figure 9:
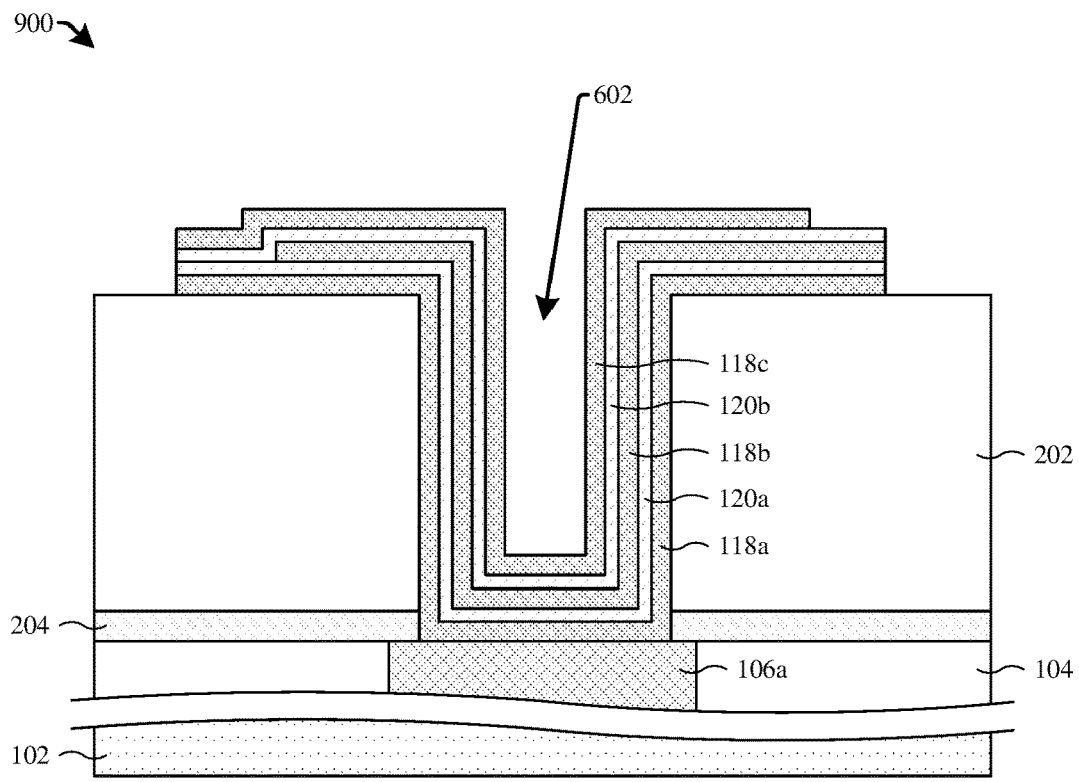

As shown in cross-sectional view 900 of FIG. 9, a second capacitor insulator structure 120b and a third metal plate 118c are formed over the second metal plate 118b. In some embodiments, a process for forming the second capacitor insulator structure 120b and the third metal plate 118c comprises forming a second capacitor insulator layer (not shown) over/on the third IMD structure 202, over/on the first capacitor insulator structure 120a, over/on the second metal plate 118b, and in the opening 602. The second capacitor insulator layer may be formed in a substantially similar process as the first capacitor insulator layer 704 (see, e.g., FIG. 7). Thereafter, a third metal layer (not shown) is formed over/on the second capacitor insulator layer and in the opening 602. The third metal layer may be formed in a substantially similar process as the first metal layer 702 and/or second metal layer 706 (see, e.g., FIG. 7).

Thereafter, a first patterned masking layer (not shown) (e.g., positive/negative photoresist, a hardmask, etc.) is formed on/over the third metal layer and in the opening 602. The first patterned masking layer may be formed by depositing a masking layer (not shown) on/over the third metal layer (e.g., via a spin-on process), exposing the masking layer to a first pattern (e.g., via a lithography process, such as photolithography, extreme ultraviolet lithography, or the like), and developing the masking layer to form the first patterned masking layer.

With the first patterned masking layer in place, a first etching process is performed on the third metal layer. The first etching process is performed on the third metal layer to remove unmasked portions of the third metal layer, thereby leaving masked portions of the third metal layer in place as the third metal plate 118c. In some embodiments, the first etching process may be, for example, a wet etching process, a dry etching process, a RIE process, some other etching process, or a combination of the foregoing. In further embodiments, the first etching process stops on the second capacitor insulator layer. In yet further embodiments, the first patterned masking layer is subsequently stripped away.

After the third metal plate 118c is formed, a second patterned masking layer (not shown) (e.g., positive/negative photoresist, a hardmask, etc.) is formed on/over the third metal plate 118c and the second capacitor insulator layer. The second patterned masking layer may be formed in a substantially similar process as the first patterned masking layer. Thereafter, with the second patterned masking layer in place, a second etching process is performed on the second capacitor insulator layer to remove unmasked portions of the second capacitor insulator layer, thereby leaving masked portions of the second capacitor insulator layer in place as the second capacitor insulator structure 120b. In some embodiments, the second etching process may be, for example, a wet etching process, a dry etching process, a RIE process, some other etching process, or a combination of the foregoing. In further embodiments, the second patterned masking layer is subsequently stripped away.

Figure 10:
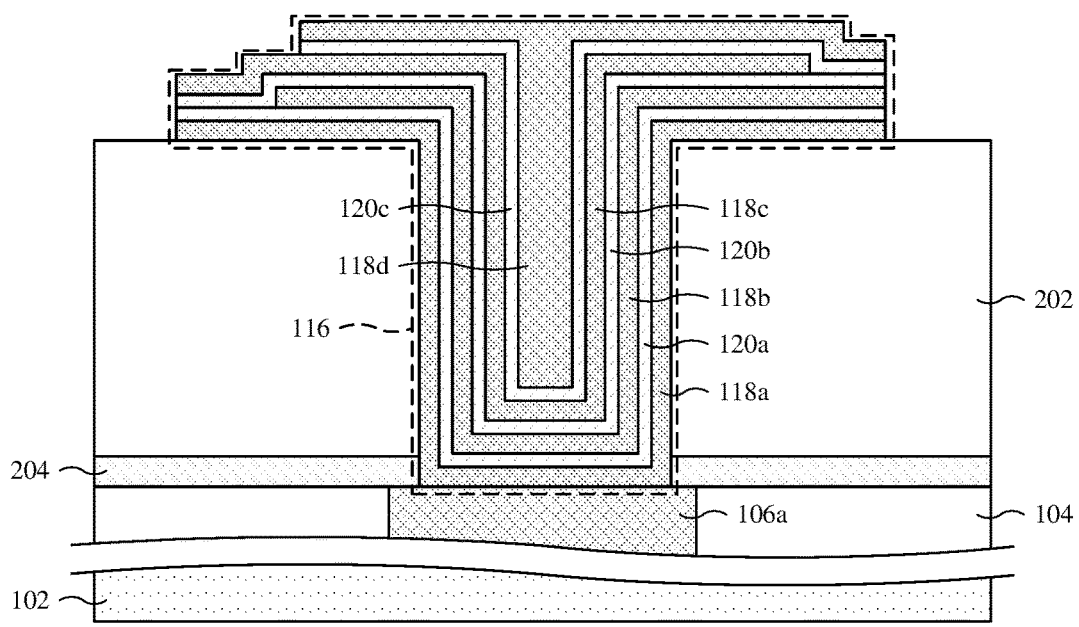

As shown in cross-sectional view 1000 of FIG. 10, a third capacitor insulator structure 120c and a fourth metal plate 118d are formed over the third metal plate 118c. In some embodiments, a process for forming the third capacitor insulator structure 120c and the fourth metal plate 118d comprises forming a third capacitor insulator layer (not shown) over/on the third IMD structure 202, over/on the second capacitor insulator structure 120b, over/on the third metal plate 118c, and in the opening 602. The third capacitor insulator layer may be formed in a substantially similar process as the first capacitor insulator layer 704 and/or the second capacitor insulator layer (see, e.g., FIGS. 7-9). Thereafter, a fourth metal layer (not shown) is formed over/on the third capacitor insulator layer and in the opening 602. The fourth metal layer fills (e.g., completely fills) the opening 602. The fourth metal layer may be formed in a substantially similar process as the first metal layer 702, the second metal layer 706, and/or the third metal layer (see, e.g., FIGS. 7-9).

Thereafter, a first patterned masking layer (not shown) (e.g., positive/negative photoresist, a hardmask, etc.) is formed on/over the fourth metal layer. The first patterned masking layer may be formed by depositing a masking layer (not shown) on/over the fourth metal layer (e.g., via a spin-on process), exposing the masking layer to a first pattern (e.g., via a lithography process, such as photolithography, extreme ultraviolet lithography, or the like), and developing the masking layer to form the first patterned masking layer.

With the first patterned masking layer in place, a first etching process is performed on the fourth metal layer. The first etching process is performed on the fourth metal layer to remove unmasked portions of the fourth metal layer, thereby leaving masked portions of the fourth metal layer in place as the fourth metal plate 118d. In some embodiments, the first etching process may be, for example, a wet etching process, a dry etching process, a RIE process, some other etching process, or a combination of the foregoing. In further embodiments, the first etching process stops on the third capacitor insulator layer. In yet further embodiments, the first patterned masking layer is subsequently stripped away.

After the fourth metal plate 118d is formed, a second patterned masking layer (not shown) (e.g., positive/negative photoresist, a hardmask, etc.) is formed on/over the fourth metal plate 118d and the third capacitor insulator layer. The second patterned masking layer may be formed in a substantially similar process as the first patterned masking layer. Thereafter, with the second patterned masking layer in place, a second etching process is performed on the third capacitor insulator layer to remove unmasked portions of the third capacitor insulator layer, thereby leaving masked portions of the third capacitor insulator layer in place as the third capacitor insulator structure 120c. In some embodiments, the second etching process may be, for example, a wet etching process, a dry etching process, a RIE process, some other etching process, or a combination of the foregoing. In further embodiments, the second patterned masking layer is subsequently stripped away.

In some embodiments, after the fourth metal plate 118d and the third capacitor insulator structure 120c are formed, formation of the MIM device 116 is complete. While FIGS. 5-10 illustrate the formation of four (4) metal plates and three (3) capacitor insulator structures, it will be appreciated that the above processes may be utilized to form N metal plates, where N is any real number greater than or equal to three (3), and N-1 (N minus 1) capacitor insulator structures. In such embodiments, once the Nth metal plate and the Nth minus one (1) capacitor insulator structure are formed, formation of the MIM device 116 may be complete.

Figure 11:
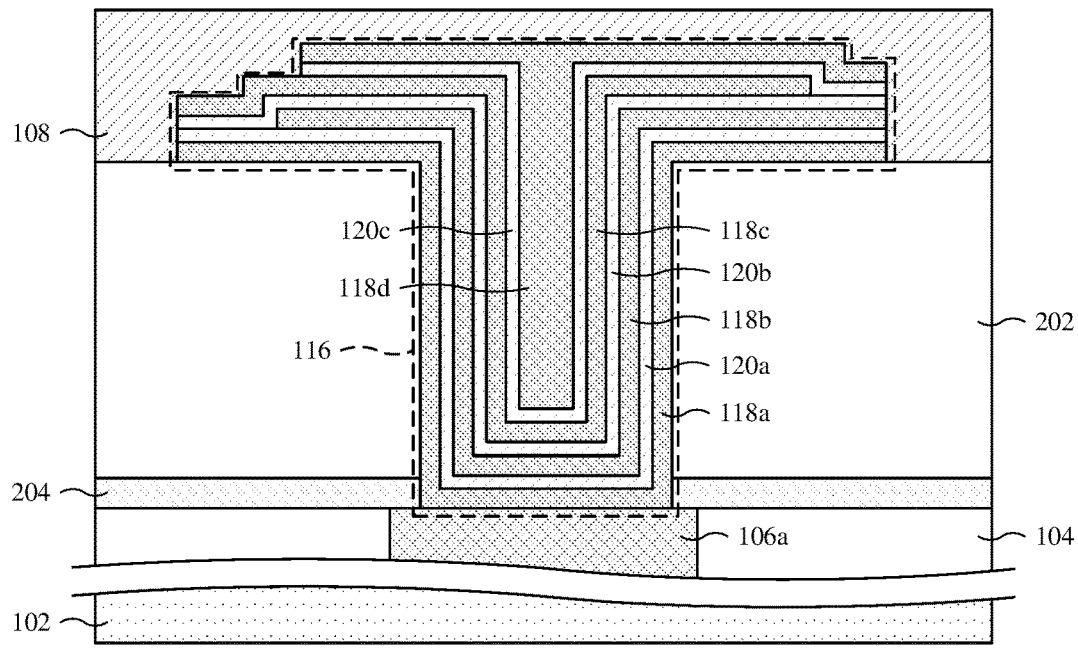

As shown in cross-sectional view 1100 of FIG. 11, a first dielectric structure 108 is formed over the MIM device 116 and the third IMD structure 202. In some embodiments, a process for forming the first dielectric structure 108 comprises depositing the first dielectric structure 108 on/over the MIM device 116 and the third IMD structure 202. The first dielectric structure 108 may be deposited by, for example, CVD, PVD, ALD, some other deposition process, or a combination of the foregoing.

Figure 12:
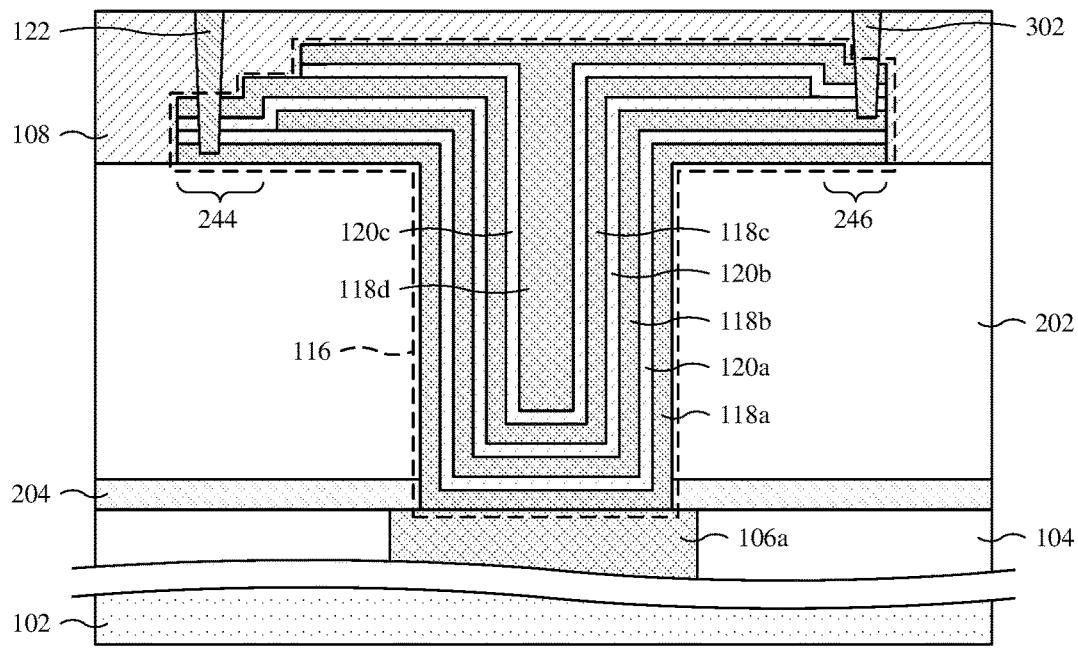

As shown in cross-sectional view 1200 of FIG. 12, a first conductive contact 122 and a second conductive contact 302 are formed in the first dielectric structure 108. The first conductive contact 122 is formed electrically coupled to a first group of metal plates. For example, the first group of metal plates comprises the first metal plate 118a and the third metal plate 118c, and the first conductive contact 122 is formed electrically coupled to both the first metal plate 118a and the third metal plate 118c. The second conductive contact 302 is formed electrically coupled to a second group of metal plates. For example, the second group of metal plates comprises the second metal plate 118b and the fourth metal plate 118d, and the second conductive contact 302 is formed electrically coupled to both the second metal plate 118b and the fourth metal plate 118d. The first conductive contact 122 and the second conductive contact 302 are formed laterally separated and electrically isolated (e.g., via the first dielectric structure 108) from one another.

In some embodiments, a process for forming the first conductive contact 122 and the second conductive contact 302 comprises forming a first contact opening and a second contact opening in the first dielectric structure 108. The first contact opening is also formed in the third metal plate 118c, the second capacitor insulator structure 120b, the first capacitor insulator structure 120a, and the first metal plate 118a. In some embodiments, a bottom of the first contact opening is defined by an upper surface of the first metal plate 118a. The first contact opening is formed within a perimeter of a first landing area 244 (see, FIG. 2). The second contact opening is also formed in the fourth metal plate 118d, the third capacitor insulator structure 120c, the second capacitor insulator structure 120b, and the second metal plate 118b. In some embodiments, a bottom of the second contact opening is defined by an upper surface of the second metal plate 118b. The bottom of the second contact opening is disposed over an underlying, upper surface of the first metal plate 118a. The second contact opening is formed within a perimeter of a second landing area 246 (see, FIG. 2).

In some embodiments, a process for forming the first contact opening and the second contact opening comprising forming a pattern masking layer (not shown) (e.g., positive/negative photoresist, a hardmask, etc.) on an upper surface of the first dielectric structure 108. With the patterned masking layer in place, one or more etching processes (e.g., wet etching process, dry etching process, RIE process, etc.) are performed on the first dielectric structure 108, the fourth metal plate 118d, the third capacitor insulator structure 120c, the third metal plate 118c, the second capacitor insulator structure 120b, the second metal plate 118b, the first capacitor insulator structure 120a, and the first metal plate 118a according to the patterned masking layer, thereby forming the first contact opening and the second contact opening. In some embodiments, the patterned masking layer is subsequently stripped away.

After the first contact opening and the second contact opening are formed, a conductive material (e.g., Cu, Al, Au, Ag, etc.) is formed on the first dielectric structure 108 and in both the first and second contact openings. The conductive material may be formed using a deposition process (e.g., CVD, PVD, sputtering, etc.) and/or a plating process (e.g., electrochemical plating, electroless plating, etc.). A planarization process (e.g., chemical mechanical polishing (CMP)) is then performed on the conductive material to form the first conductive contact 122 and the second conductive contact 302 in the first dielectric structure 108. The planarization process is also performed on the first dielectric structure 108, thereby co-planarizing upper surfaces of the first dielectric structure 108, the first conductive contact 122, and the second conductive contact 302. Because the plurality of metal layers 118 and the plurality of capacitor insulator structures 120 are formed to have the structure illustrated in the cross-sectional view 1000 of FIG. 10 (e.g., having the first landing area 244 and the second landing area 246), the first conductive contact 122 and the second conductive contact 302 may be formed at the same time (e.g., a same patterning process, a same deposition/plating process, etc.), thereby reducing a cost to fabricate the MIM device 116 (e.g., due to a reduction in the number of masks/layers).

Figure 13:
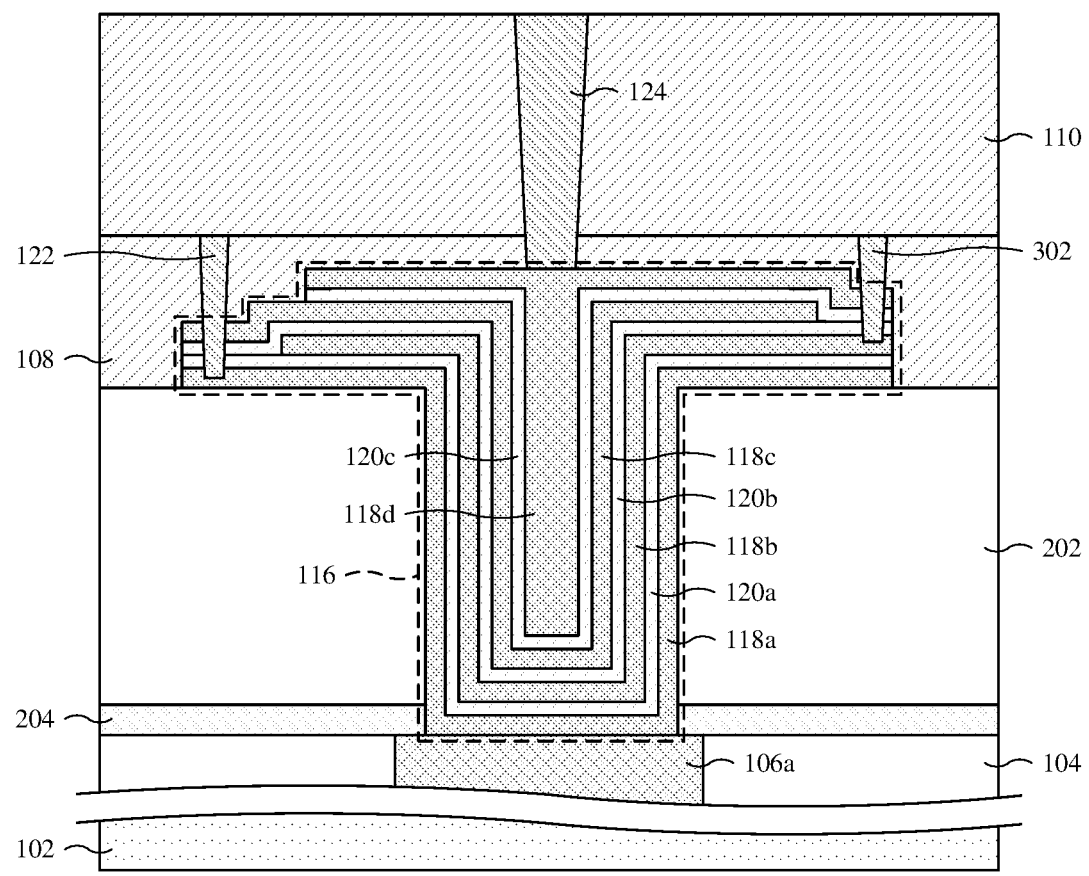

As shown in cross-sectional view 1300 of FIG. 13, a second dielectric structure 110 is formed over the first dielectric structure 108, the first conductive contact 122, the second conductive contact 302, and the MIM device 116. Further, a conductive via 124 is formed in the second dielectric structure 110 and the first dielectric structure 108. The conductive via 124 is formed electrically coupled to the fourth metal plate 118*d*.

In some embodiments, a process for forming the conductive via 124 and the second dielectric structure 110 comprises depositing the second dielectric structure 110 on/over the first dielectric structure 108, the first conductive contact 122, and the second conductive contact 302. The second dielectric structure 110 may be deposited by, for example, CVD, PVD, ALD, some other deposition process, or a combination of the foregoing.

Thereafter, a via opening is formed in the second dielectric structure 110 and the first dielectric structure 108. The via opening exposes an upper surface of the fourth metal plate 118*d*. Thereafter, a conductive material (e.g., Cu, Al, Au, Ag, etc.) is formed over the second dielectric structure 110 and in the via opening. The conductive material may be formed using a deposition process (e.g., CVD, PVD, sputtering, etc.) and/or a plating process (e.g., electrochemical plating, electroless plating, etc.). A planarization process (e.g., CMP) is then performed on the conductive material to form the conductive via 124 in the second dielectric structure 110. The planarization process is also performed on the second dielectric structure 110, thereby co-planarizing upper surfaces of the second dielectric structure 110 and the conductive via 124.

Figure 14:
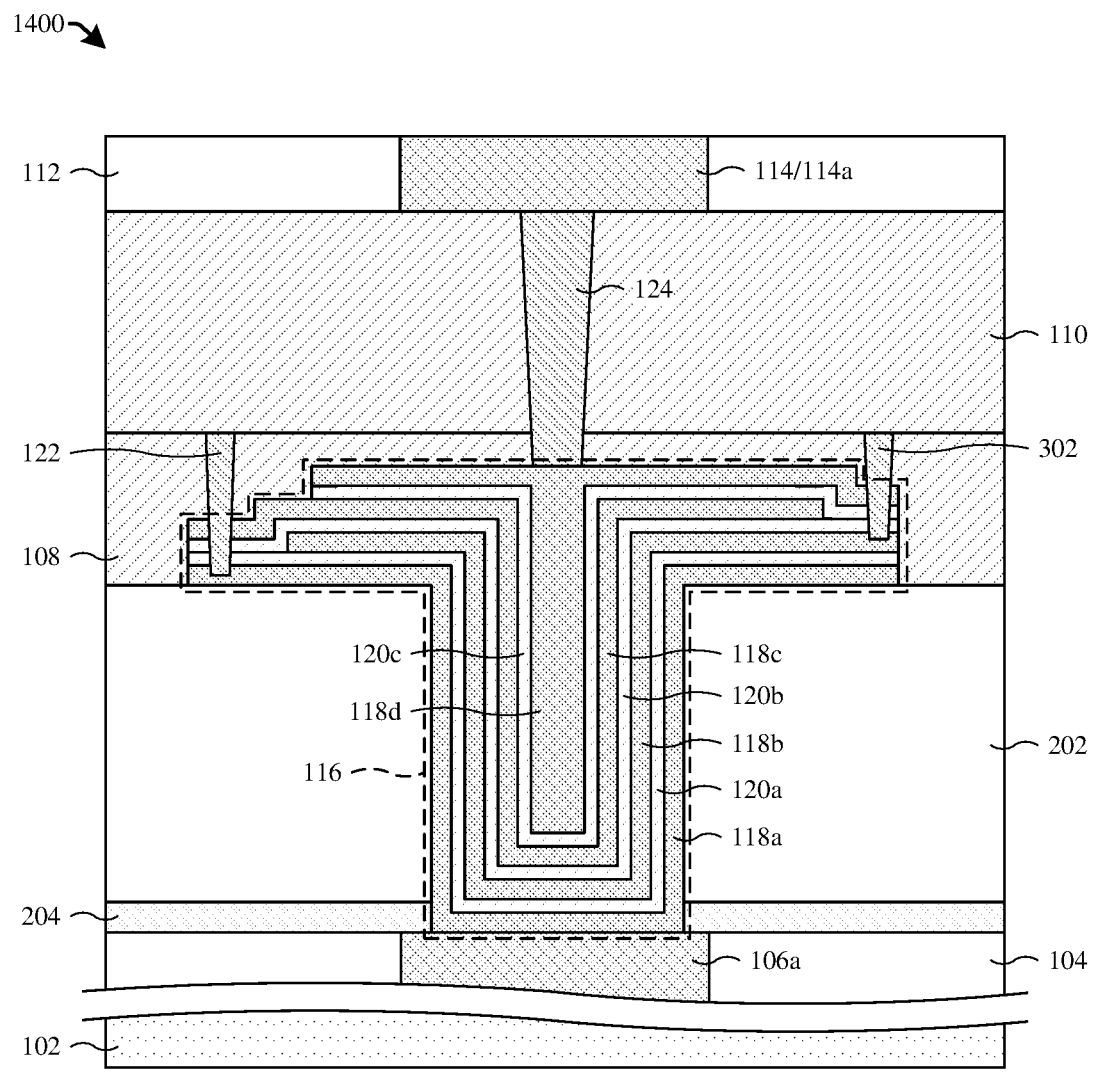

As shown in cross-sectional view 1400 of FIG. 14, a second IMD structure 112 is formed over the second dielectric structure 110 and the conductive via 124. Further, a first conductive feature 114*a* (e.g., copper wire) of a second interconnect structure 114 is formed in the second IMD structure 112 and over the conductive via 124. The first conductive feature 114*a* of the second interconnect structure 114 is formed electrically coupled to the conductive via 124.

In some embodiments, a process for forming the second IMD structure 112 and the first conductive feature 114*a* of the second interconnect structure 114 comprises depositing an IMD layer (e.g., low-k dielectric layer) on/over the second dielectric structure 110 and the conductive via 124. The IMD layer may be deposited by, for example, CVD, PVD, ALD, some other deposition process, or a combination of the foregoing.

Thereafter, a trench (or opening) is formed in the IMD layer and (directly) over the conductive via 124. The trench (or opening) exposes an upper surface of the conductive via 124. A conductive material (e.g., Cu) is then formed over the IMD layer and in the trench (or opening). The conductive material may be formed using a deposition process (e.g., CVD, PVD, sputtering, etc.) and/or a plating process (e.g., electrochemical plating, electroless plating, etc.). A planarization process (e.g., CMP) is then performed on the conductive material and the IMD layer to form the first conductive feature 114*a* of the second interconnect structure 114 in the second IMD structure 112. Although not shown, it will be appreciated that any number of other conductive features (e.g., conductive lines and conductive vias) and/or IMD layers may be formed over the IMD layer and the first conductive feature 114*a* of the interconnect structure 114 to complete formation of the second interconnect structure 114.

Figure 15:
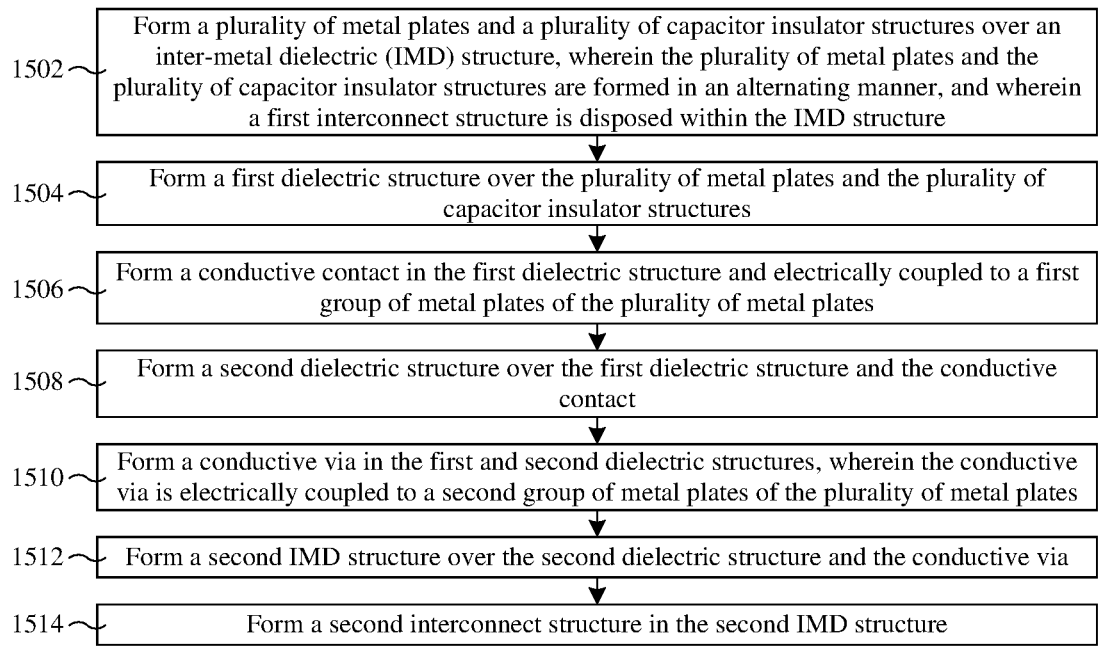
FIG. 15 illustrates a flowchart of some embodiments of a method for forming an IC having a metal-insulator-metal MIM device with improved performance.

FIG. 15 illustrates a flowchart 1500 of some embodiments of a method for forming an IC having a metal-insulator-metal MIM device with improved performance. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502, a plurality of metal plates and a plurality of capacitor insulator structures are formed over an inter-metal dielectric (IMD) structure, wherein the plurality of metal plates and the plurality of capacitor insulator structures are formed in an alternating manner, and wherein a first interconnect structure is disposed within the IMD structure. FIGS. 5-10 illustrate a series of cross-sectional views 500-1000 of some embodiments corresponding to act 1502.

At act 1504, a first dielectric structure is formed over the plurality of metal plates and the plurality of capacitor insulator structures. FIG. 11 illustrates a cross-sectional view 1100 of some embodiments corresponding to act 1504.

At act 1506, a conductive contact is formed in the first dielectric structure and electrically coupled to a first group of metal plates of the plurality of metal plates. FIG. 12 illustrates a cross-sectional view 1200 of some embodiments corresponding to act 1506.

At act 1508, a second dielectric structure is formed over the first dielectric structure and the conductive contact. FIG. 13 illustrates a cross-sectional view 1300 of some embodiments corresponding to act 1508.

At act 1510, a conductive via is formed in the first and second dielectric structures, wherein the conductive via is electrically coupled to a second group of metal plates of the plurality of metal plates. FIG. 13 illustrates a cross-sectional view 1300 of some embodiments corresponding to act 1510.

At act 1512, a second IMD structure is formed over the second dielectric structure and the conductive via. FIG. 14 illustrates a cross-sectional view 1400 of some embodiments corresponding to act 1512.

At act 1514, a second interconnect structure is formed in the second IMD structure. FIG. 14 illustrates a cross-sectional view 1400 of some embodiments corresponding to act 1514.

In some embodiments, the present application provides an integrated chip (IC). The IC comprises a first inter-metal dielectric (IMD) structure disposed over a semiconductor substrate. A metal-insulator-metal (MIM) device is disposed over the first IMD structure. The MIM device comprises at least three metal plates that are spaced from one another. The MIM device also comprises a plurality of capacitor insulator structures, wherein each of the plurality of capacitor insulator structures are disposed between and electrically isolate neighboring metal plates of the at least three metal plates.

In some embodiments, the present application provides metal-insulator-metal (MIM) device. The MIM device comprises a dielectric structure disposed over a semiconductor substrate. A first metal plate is disposed over the dielectric structure. A first capacitor insulator structure is disposed over the first metal plate. A second metal plate is disposed over the first capacitor insulator structure, wherein the first capacitor insulator structure electrically insulates the first metal plate from the second metal plate. A second capacitor insulator structure is disposed over the second metal plate and the first capacitor insulator structure. A third metal plate is disposed over the second capacitor insulator structure, wherein the second capacitor insulator structure electrically insulates the second metal plate from the third metal plate. A first conductive structure is disposed over the dielectric structure and electrically coupled to both the first metal plate and the third metal plate. A second conductive structure is disposed over the dielectric structure and laterally spaced from the first conductive structure, wherein the second conductive structure is electrically coupled to the second metal plate.

In some embodiments, the present application provides a method for forming a metal-insulator-metal (MIM) device. The method comprises forming a first dielectric layer over a semiconductor substrate. An opening is formed in the first dielectric layer. A first metal plate is formed in the opening and over an upper surface of the first dielectric layer. A first capacitor insulator structure is formed in the opening and over the first metal plate. A second metal plate is formed in the opening and over the first capacitor insulator structure. A second capacitor insulator structure is formed in the opening and over the second metal plate. A third metal plate is formed in the opening and over the second capacitor insulator structure. A second dielectric layer is formed over the first dielectric layer, the first metal plate, the first capacitor insulator structure, the second metal plate, the second capacitor insulator structure, and the third metal plate. A first conductive structure is formed in the second dielectric layer and electrically coupled to both the first metal plate and the third metal plate. A second conductive structure is formed in the second dielectric layer and electrically coupled to second metal plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a metal-insulator-metal (MIM) device, the method comprising:
   patterning an inter-metal dielectric (IMD) layer over a substrate to form an opening within the IMD layer;
   forming a first conductive layer in the opening and conformally covering at least a part of the IMD layer;
   forming a first capacitor dielectric conformally covering at least a part of the first conductive layer;
   forming a second conductive layer conformally covering at least a part of the first capacitor dielectric;
   forming a second capacitor dielectric conformally covering at least a part of the second conductive layer;
   forming a third conductive layer conformally covering at least a part of the second capacitor dielectric;
   forming a first conductive structure to extend through the third conductive layer and to the first conductive layer, wherein an outermost sidewall of the second conductive layer is horizontally offset and faces towards an outer sidewall of the first conductive structure; and
   forming a second conductive structure on the second conductive layer.

2. The method of claim 1,
   wherein the first conductive layer extends laterally past the outermost sidewall of the second conductive layer in a first direction; and
   wherein the third conductive layer extends laterally past the outermost sidewall of the second conductive layer in the first direction.

3. The method of claim 2, wherein the second conductive layer extends laterally past an outermost sidewall of the third conductive layer in a second direction that opposes the first direction.

4. The method of claim 1, wherein the second capacitor dielectric contacts the first capacitor dielectric outside of the second conductive layer.

5. The method of claim 1, wherein the second capacitor dielectric extends along the outermost sidewall of the second conductive layer that is directly over the first conductive layer.

6. The method of claim 1,
   wherein a portion of the first capacitor dielectric is disposed laterally between a first sidewall of the second conductive layer facing a first direction and a first sidewall of the first conductive layer facing the first direction; and
   wherein a portion of the second capacitor dielectric is disposed laterally between the first sidewall of the second conductive layer and the first sidewall of the first conductive layer.

7. The method of claim 6, wherein:
   the portion of the second capacitor dielectric overlies the portion of the first capacitor dielectric; and
   both the portion of the first capacitor dielectric and the portion of the second capacitor dielectric vertically separate the first conductive layer from the third conductive layer.

8. The method of claim 6, wherein the first conductive structure extends vertically through both the portion of the first capacitor dielectric and the portion of the second capacitor dielectric.

9. The method of claim 1, further comprising:
   forming a third capacitor dielectric onto the third conductive layer; and forming a fourth conductive layer over the third capacitor dielectric, wherein the second conductive structure vertically extends through the fourth conductive layer and the third capacitor dielectric to contact the second conductive layer.

10. A method for forming a metal-insulator-metal (MIM) device, the method comprising:
    etching an inter-metal dielectric (IMD) over a substrate to fabricate sidewalls of the IMD that form an opening within the IMD;
    forming a first conductive layer in the opening and conformally covering at least a part of the IMD;
    forming a first capacitor dielectric conformally covering at least a part of the first conductive layer;
    forming a second conductive layer conformally covering at least a part of the first capacitor dielectric;
    forming a second capacitor dielectric conformally covering at least a part of an upper surface of the second conductive layer;
    forming a third conductive layer conformally covering at least a part of the second capacitor dielectric;
    forming a first conductive contact to contact the third conductive layer and the first conductive layer, wherein the second capacitor dielectric is arranged along an outermost sidewall of the second conductive layer and along opposing outermost sidewalls of the first conductive contact laterally outside of the second conductive layer; and
    forming a second conductive contact to contact the second conductive layer.

11. The method of claim 10,
    wherein the first capacitor dielectric has a first outermost sidewall opposite a second outermost sidewall; and
    wherein the second conductive layer has a third outermost sidewall opposite the outermost sidewall, wherein the first outermost sidewall is laterally aligned with the third outermost sidewall, and wherein the second outermost sidewall is laterally offset from the outermost sidewall by a non-zero distance.

12. The method of claim 10, wherein the first conductive layer, the second conductive layer, and the third conductive layer are disposed both partially below an uppermost surface of the IMD and partially over the uppermost surface of the IMD.

13. The method of claim 10, wherein an upper surface of the first capacitor dielectric contacts a lower surface of the second capacitor dielectric laterally outside of the second conductive layer.

14. The method of claim 10, further comprising:
    forming a third capacitor dielectric onto the third conductive layer; and
    forming a fourth conductive layer over the third capacitor dielectric, wherein the second conductive contact vertically extends through the fourth conductive layer and the third capacitor dielectric to contact the second conductive layer.

15. The method of claim 14, further comprising:
    forming the first conductive layer onto a lower interconnect disposed below the IMD; and
    forming an upper interconnect via onto the fourth conductive layer.

16. The method of claim 10, wherein the first conductive contact extends through an interface between an upper surface of the first capacitor dielectric and a lower surface of the second capacitor dielectric.

17. The method of claim 10, wherein the first conductive contact comprises a metal via extending from over a top of the second conductive layer to below a top of the first conductive layer.

18. The method of claim 10, wherein the first capacitor dielectric contacts the second capacitor dielectric between an outermost sidewall of the first conductive layer and the outermost sidewall of the second conductive layer that both face in a first direction.

19. The method of claim 18, further comprising:
    forming a third capacitor dielectric conformally covering at least a part of the third conductive layer; and
    forming a fourth conductive layer conformally covering at least a part of the third capacitor dielectric, wherein the second capacitor dielectric contacts the third capacitor dielectric between outermost sidewalls of the third conductive layer and the fourth conductive layer that both face in a second direction opposite the first direction.

20. A method for forming a metal-insulator-metal (MIM) device, the method comprising:
    patterning an inter-metal dielectric (IMD) over a substrate to fabricate sidewalls of the IMD that form an opening within the IMD;
    forming a first conductive layer in the opening and conformally covering at least a part of the IMD;
    forming a first capacitor dielectric conformally covering at least a part of the first conductive layer;
    forming a second conductive layer conformally covering at least a part of the first capacitor dielectric;
    forming a second capacitor dielectric conformally covering at least a part of the second conductive layer and contacting an upper surface of the first capacitor dielectric;
    forming a third conductive layer conformally covering at least a part of the second capacitor dielectric, the second capacitor dielectric having an upper surface laterally outside of the third conductive layer;
    forming a first conductive structure to physically contact the third conductive layer and the first conductive layer laterally outside of an outermost boundary of the second conductive layer; and
    forming a second conductive structure to contact the second conductive layer.

* * * * *